(12) United States Patent
Rogers et al.

(10) Patent No.: US 9,767,241 B2
(45) Date of Patent: Sep. 19, 2017

(54) METHOD AND APPARATUS FOR PRINTED CIRCUIT BOARD WITH STIFFENER

(75) Inventors: Norman L. Rogers, Davis, CA (US); John W. Hoffman, Quincy, CA (US); Jun Feng, Davis, CA (US); Charles Krauter, Sacramento, CA (US)

(73) Assignee: Digi International Inc., Minnetonka, MN (US)

( * ) Notice: Subject to any disclaimer, the term of this patent is extended or adjusted under 35 U.S.C. 154(b) by 1723 days.

(21) Appl. No.: 12/749,254

(22) Filed: Mar. 29, 2010

(65) Prior Publication Data

US 2010/0175916 A1 Jul. 15, 2010

Related U.S. Application Data

(63) Continuation of application No. 11/231,642, filed on Sep. 21, 2005, now Pat. No. 7,721,238.
(Continued)

(51) Int. Cl.
*G06F 17/50* (2006.01)
*H05K 1/02* (2006.01)
(Continued)

(52) U.S. Cl.
CPC ....... *G06F 17/5068* (2013.01); *H05K 1/0206* (2013.01); *H05K 1/029* (2013.01); *H05K 1/0295* (2013.01); *H05K 1/111* (2013.01); *H05K 1/114* (2013.01); *H05K 3/0005* (2013.01); *H05K 3/0064* (2013.01); *H05K 2201/093* (2013.01); *H05K 2201/09309* (2013.01); *H05K 2201/09418* (2013.01); *H05K 2201/09454* (2013.01);
(Continued)

(58) Field of Classification Search
CPC .. G06F 17/5068; H05K 1/0206; H05K 1/029; H05K 1/0295; H05K 1/111; H05K 1/114; H05K 2201/093; H05K 2201/09309; H05K 2201/09418; H05K 2201/09454; H05K 2201/09663; H05K 2201/09954; H05K 2201/10
USPC ........... 716/137; 174/255, 260, 261; 29/825, 29/828
See application file for complete search history.

(56) References Cited

U.S. PATENT DOCUMENTS 4,492,730 A 1/1985 Oishi et al.
4,563,725 A 1/1986 Kirby
(Continued)

OTHER PUBLICATIONS

Syntor X 9000 Boards, Motorola Mobile Radios, Jun. 20, 2005 http://www.open.org/~blenderm/syntorx/boardsx9.html.
(Continued)

*Primary Examiner* — Vuthe Siek
(74) *Attorney, Agent, or Firm* — Heimlich Law, PC; Alan Heimlich, Esq.

(57) ABSTRACT

A method and apparatus for inputting a plurality of different circuit schematics designed with printed circuit board (PCB) mountable components; extracting circuit topologies for said plurality of different circuit schematics; transforming said extracted circuit topologies to a fixed number of connection points; and generating a configurable circuit PCB physical layout pattern having said fixed number of connection points such that said PCB mountable components when positioned on one or more of said fixed number of connection points can implement any circuit represented by said plurality of different circuit schematics.

11 Claims, 26 Drawing Sheets

Related U.S. Application Data

(60) Provisional application No. 60/612,422, filed on Sep. 22, 2004.

(51) Int. Cl.
*H05K 1/11* (2006.01)
*H05K 3/00* (2006.01)

(52) U.S. Cl.
CPC .............. *H05K 2201/09663* (2013.01); *H05K 2201/09954* (2013.01); *H05K 2201/10022* (2013.01); *H05K 2201/10166* (2013.01); *H05K 2201/10636* (2013.01); *H05K 2203/173* (2013.01); *Y02P 70/611* (2015.11); *Y10T 29/49117* (2015.01); *Y10T 29/49124* (2015.01)

(56) References Cited

U.S. PATENT DOCUMENTS

| | | | |
|---|---|---|---|
| 4,628,407 A | 12/1986 | August et al. | |
| 4,788,523 A | 11/1988 | Robbins | |
| 4,810,563 A | 3/1989 | DeGree et al. | |
| 5,045,642 A | 9/1991 | Ohta et al. | |
| 5,377,124 A | 12/1994 | Mohsen | |
| 5,468,919 A | 11/1995 | Shiozaki et al. | |
| 5,537,295 A | 7/1996 | Van Den Bout et al. | |
| 5,548,269 A | 8/1996 | Katsuno et al. | |
| 5,808,259 A | 9/1998 | Spinner | |
| 5,844,168 A * | 12/1998 | Schueller | H01L 23/13 174/262 |
| 5,999,410 A | 12/1999 | Weiler | |
| 6,058,004 A | 5/2000 | Duva et al. | |
| 6,201,701 B1 | 3/2001 | Linden et al. | |
| 6,215,649 B1 * | 4/2001 | Appelt et al. | 361/312 |
| 6,462,978 B2 | 10/2002 | Shibata et al. | |
| 6,493,240 B2 | 12/2002 | Broglia et al. | |
| 6,542,834 B1 | 4/2003 | Dixit | |
| 6,557,154 B1 | 4/2003 | Harada et al. | |
| 6,650,546 B2 | 11/2003 | Nelson et al. | |
| 6,734,368 B1 | 5/2004 | Jimarez et al. | |
| 6,740,821 B1 | 5/2004 | Jiang et al. | |
| 2001/0000156 A1 * | 4/2001 | Cheng | 438/612 |
| 2003/0028630 A1 | 2/2003 | Bischof et al. | |
| 2004/0012938 A1 * | 1/2004 | Sylvester | H01L 21/4857 361/794 |
| 2004/0125578 A1 | 7/2004 | Konishi et al. | |
| 2004/0267977 A1 | 12/2004 | Sriram | |
| 2005/0245062 A1 * | 11/2005 | Kingsbury et al. | 438/617 |
| 2005/0247761 A1 * | 11/2005 | Albanese | B23K 1/0016 228/201 |
| 2005/0285255 A1 * | 12/2005 | Walk | 257/700 |
| 2008/0106475 A1 * | 5/2008 | Jandzio et al. | 343/700 MS |

OTHER PUBLICATIONS

Ghielmetti Communications, Matrix Boards, Jun. 20, 2005 http://www.ghielmetti.ch/.

Thomas, Edward N2IHN, "Modifications for the Kenwood TM-721", Jun. 20, 2005 http://www.radiomods.co.nz/kenwood/kenwoodtm721.html.

Vinger, Knut Arne and Torresen, Jim "Implementing Evolution of FIR-Filters Efficiently in an FPGA" Department of Informatics, University of Oslo, Oslo,Norway, Journal Title: Evolvable Hardware, 2003 http://doi.ieeecomputersociety.org/10.1109/EH.2003.1217639.

* cited by examiner

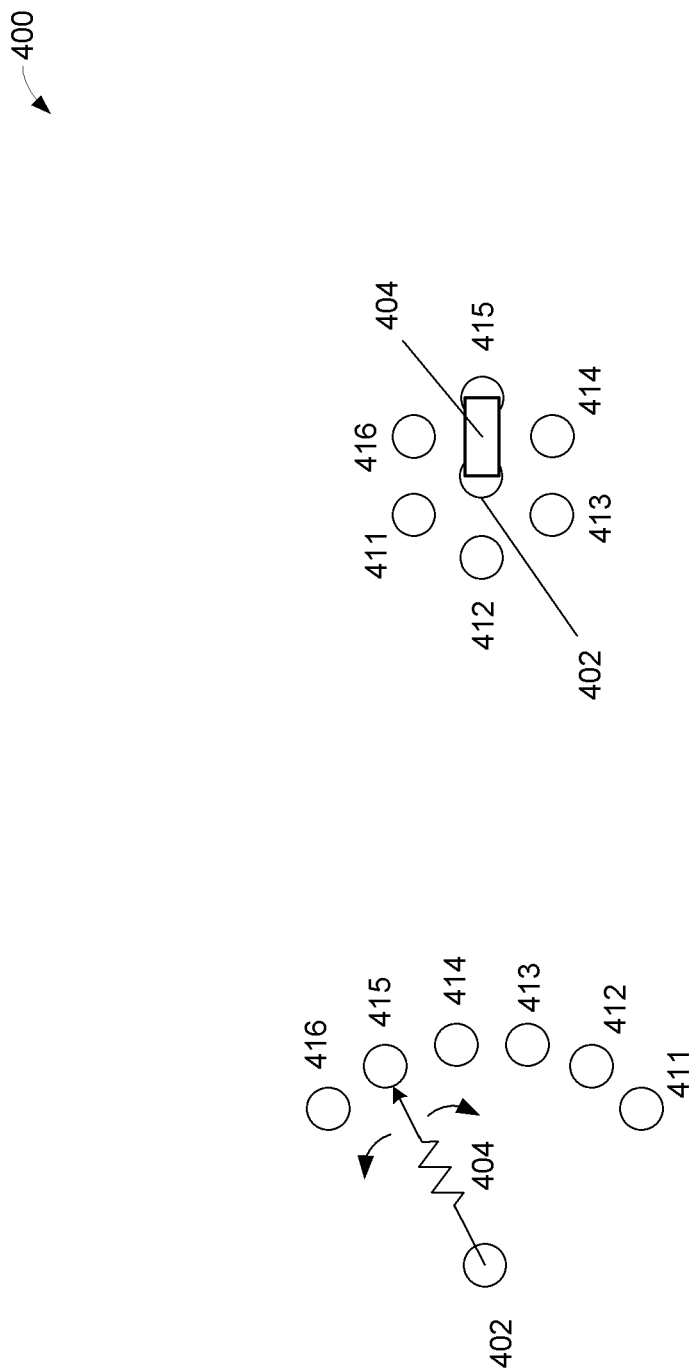

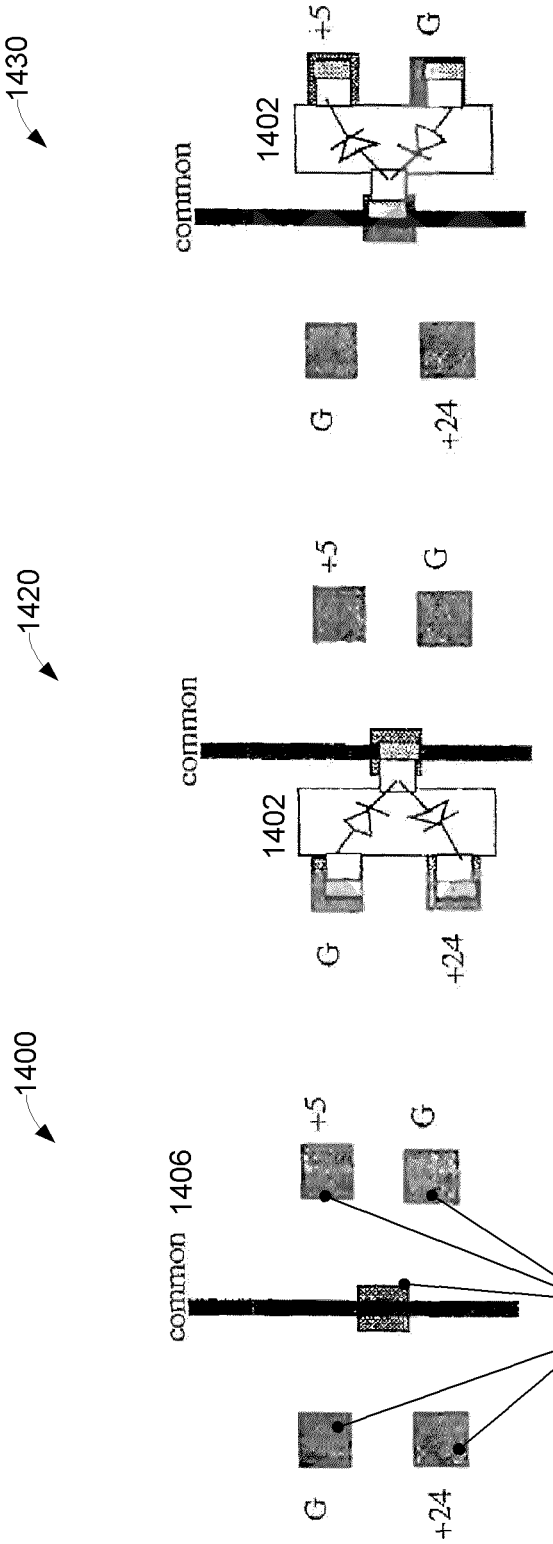
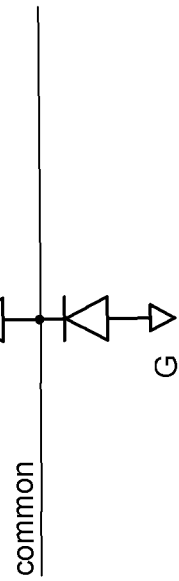
FIG. 14C
FIG. 14B
FIG. 14D
FIG. 14A

Input Circuit with attenuation and filtering

Input circuit with excitation of load

METHOD AND APPARATUS FOR PRINTED CIRCUIT BOARD WITH STIFFENER

RELATED APPLICATION

This patent application claims priority of U.S. application Ser. No. 11/231,642 filed Sep. 21, 2005 originally titled "Method and Apparatus for Configurable Circuitry" and U.S. Provisional Application Ser. No. 60/612,422 filed Sep. 22, 2004 titled "Method of Manufacturing Custom Embedded Controllers", which are hereby incorporated herein by reference. As of the filing date of this application, any Confidential or similar notices on documents incorporated herein by reference are explicitly declassified.

FIELD OF THE INVENTION

The present invention pertains to circuitry. More particularly, the present invention relates to a method and apparatus for configurable circuitry.

BACKGROUND OF THE INVENTION

Circuitry is universally used in many fields. It is applicable to fluidics, optics, electronics, etc.

In the field of electronics, circuitry is used to define, control, and direct operations, processing, sensing, etc. Often the topology of a circuit will define its function.

For example, an embedded controller may be built into a product and capable of providing control to devices hooked up external to the controller. Interfaces with such external devices may be classified depending on direction of control/sensing as inputs, outputs, or bidirectional. The particular configuration of inputs and outputs in embedded controllers may either be fixed or customizable. For example, in a washing machine, the embedded controller might have inputs from the temperature buttons or dials and outputs to control various motors and valves within the machine. In this way, the embedded controller provides a method for its embedded computer to interact with the outside or real world.

Embedded controllers with a fixed configuration of inputs and outputs are generally purchased off the shelf and are quickly available from manufacturers' stock. Such controllers often utilize a modular system of input/output interfaces to provide a method to customize the number and type of input output interfaces. For example, an expansion bus may be used to which the modular input/output (I/O) devices connect. This extra overhead adds to the cost of the controller. This presents a problem.

An embedded controller with just the correct number of needed I/O ports requires a custom configuration that must be specially designed and manufactured. This requires considerable up front engineering costs. Thus, custom configuration embedded controllers are generally not an option unless production volume is high enough to amortize the initial investment. A production volume of 500 units per year is often suggested as the volume needed to justify this initial cost. This presents a problem.

BRIEF DESCRIPTION OF THE DRAWINGS

The invention is illustrated by way of example and not limitation in the figures of the accompanying drawings in which:

FIG. 4A and FIG. 4B illustrate one embodiment of the present invention;

FIG. 14A, FIG. 14B, FIG. 14C, and FIG. 14D illustrate an embodiment of the invention;

DETAILED DESCRIPTION

Figure 1:
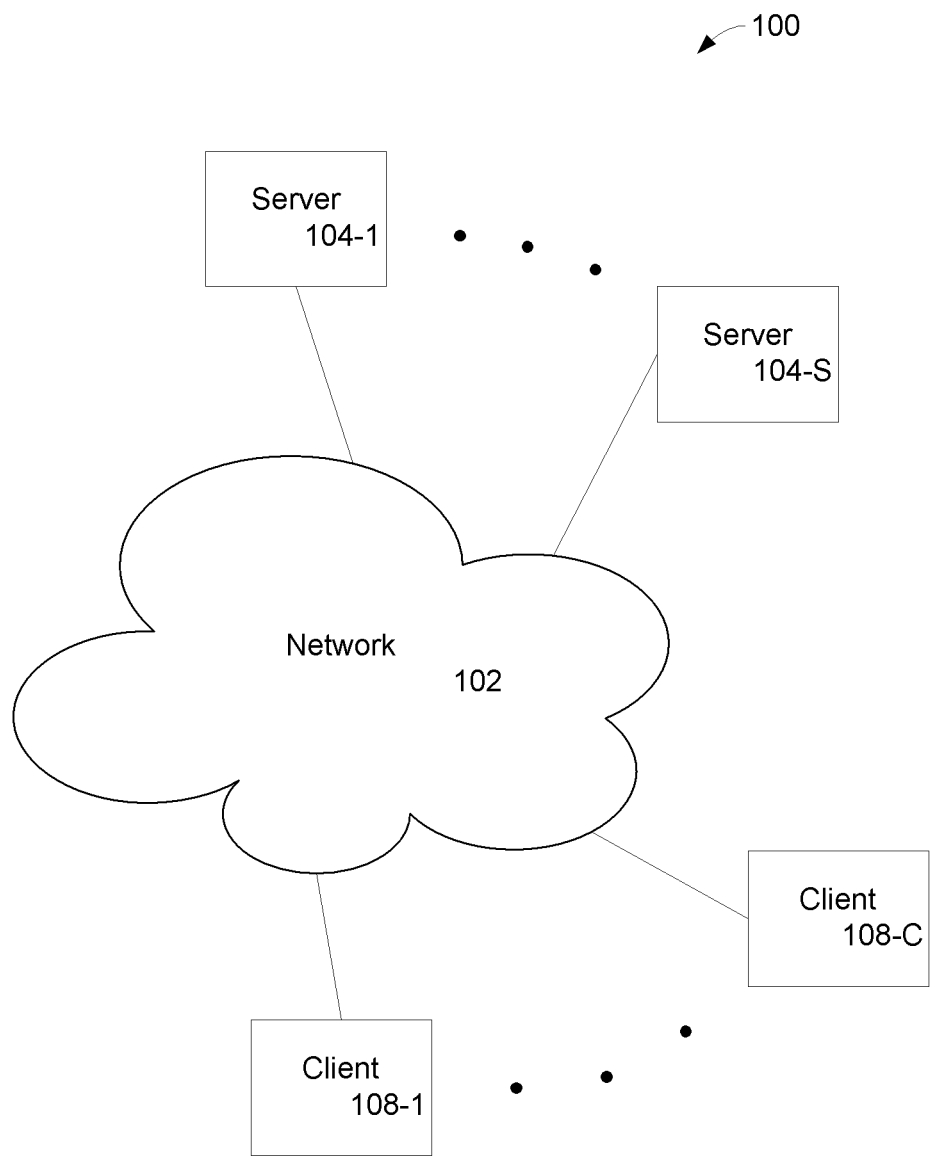
FIG. 1 illustrates a network environment in which the method and apparatus of the invention may be implemented.

In one embodiment, the present invention may be used in manufacturing a customizable embedded controller such as a single board computer (SBC), a programmable logic controller (PLC), etc. The design and function of, for example, the input/output can be customized by controlling the physical placement of components. For example, arrays of prearranged connection points, such as, but not limited to, solder pads may accept resistors, capacitors, inductors, logic circuits, transistors, and other PCB components in a variety of arrangements. In one embodiment, rectangular and hexagonal patterns of solder pads allows PCB components to be installed in various orientations, each orientation may correspond to a different functionality, a different circuit, etc. for the embedded controller.

In one embodiment of the present invention heat generated by components mounted on a Printed Circuit Board (PCB) is thermally conducted to electrically isolated, yet thermally connected, islands of the PCB. For example, heat may be conducted to islands located in the ground, power plane, or other planes and may be conducted to another plane via, for example, a thin layer of less thermally conductive insulation.

In one embodiment of the present invention a customer may interact with a system to define the customizations needed. For example, a customer may select the specific customization for a particular board by using a computer aided design (CAD) tool implemented and accessed via, for example, a web browser, a spreadsheet, or custom program. The customer's choices are entered into a database and used to program a surface mount placement machine and final test station so that an embedded controller with the desired configuration is automatically manufactured and tested. Additionally, the customer's inputs may be used to generate a customized user schematic, function table, software drivers, software declarations, and/or instruction manual for the resulting product.

In one embodiment of the invention, the configurable circuitry may be implemented as reconfigurable cells that may be configured during a manufacturing process. For example, a reconfigurable cell may be an area on a printed circuit board (or several areas connected) that has a fixed pattern of component pads and interconnecting traces. Components of different types may be placed in different locations where it is possible for the component to match up (i.e. connect) with appropriate solder pads. During the manufacturing process the circuit may take on different functionality depending upon the components connected to the pads and the locations in which they are placed.

In one embodiment of the invention, the configurable circuitry in the form of cells are fabricated at the time the PCB is fabricated. The configurability is then determined at the time the PCB is assembled with, for example, surface mount components. For example, in one embodiment of the invention, a product with input-output connections and other functionality is customized in the manufacturing process via surface mount placement of components in response to customer specifications. Such customer specifications may be entered via web pages accessible using a standard Internet browser. The configurable circuitry has components, for example chip resistors, transistors, etc. installed (or placed by an SMT machine) in variable locations. Depending upon the customer specifications, the system may also calculate such things as thermal dissipation and may place components so that heat flow is enhanced. For example, components may be spaced based on heat dissipation, or grouped for even heat distribution, and/or connections may be made or components paced, to assist in conducting heat away, to for example, islands on or within the PCB.

Figure 3:
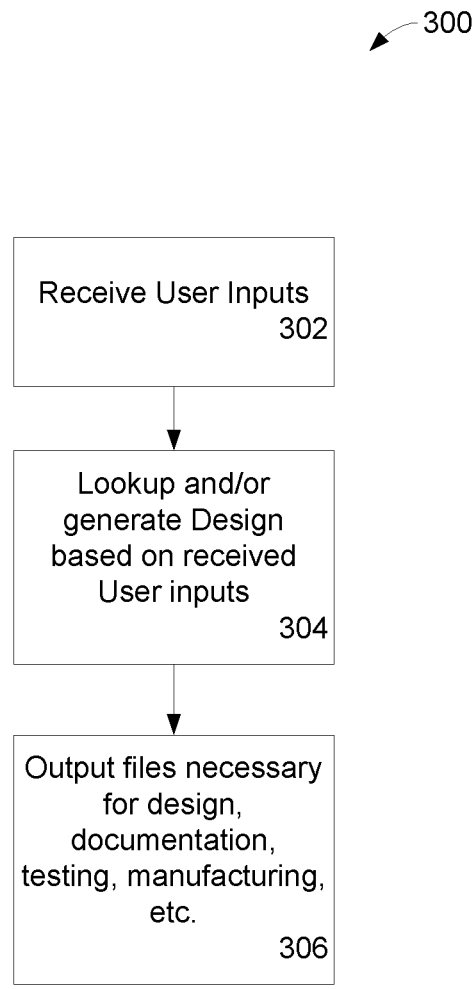
FIG. 3 illustrates one embodiment of the invention showing a flowchart.

FIG. 3 illustrates one embodiment of the invention 300 showing a flowchart. At 302 inputs from a user are received. At 304 a design based on the user inputs received is generated and/or looked up. At 306 files necessary for a variety of operations, such as, but not limited to design, documentation, testing, manufacturing, etc. are output.

As illustrated in FIG. 3, at 302 the user inputs may be received from a variety of sources, for example, the user may be situated at a CAD workstation, the inputs may come from the results of a discussion the user has with a factory representative, the user may be communicating the results from selections on a website, etc. At 304 the design based on the user inputs may, if it was previously done, be looked up. If the design is new then it may be checked. For example, the design may be checked for such things as, but not limited to, thermal considerations, parameter specifications, performance, manufacturability, logical correctness, electrical safety, etc. At 306 files necessary for implementing, testing, manufacturing, and documenting the design, among other things, are created. One of skill in the art will appreciate that many such files may be needed. For example, test specifications to assure performance with respect to static electricity susceptibility may be needed so that a hi-pot test may be performed.

FIG. 4A and FIG. 4B illustrate one embodiment 400 of the present invention. FIG. 4A illustrates in schematic form a switched arrangement having a common terminal 402, a resistance 404 (which may be zero ohms), and six contact points 411, 412, 413, 414, 415, and 416. The resistance 404 may be connected between 402 and any of the six contact points 411, 412, 413, 414, 415, and 416. FIG. 4B shows one embodiment of the present invention with a common solder pad (or common connection) 402, a resistor 404 (such as, but not limited to a chip resistor), and six contact points 411, 412, 413, 414, 415, and 416 in the form of six individual solder pads. The resistance 404 (which may be a zero ohm resistor) may be connected between 402 and any of the six contact points 411, 412, 413, 414, 415, and 416 by placing the resistance 404 between pad 402 and one of the six contact pads 411, 412, 413, 414, 415, and 416. One of skill in the art will appreciate that the resistance 404 merely represents a component and that other components, such as, but not limited to, capacitors, inductors, crystals, diodes, or combinations of components may be substituted in place of the resistance 404. For example, an RC filter may be constructed such that the capacitance is switched to various resistances to achieve the desired roll-off.

Figure 5:
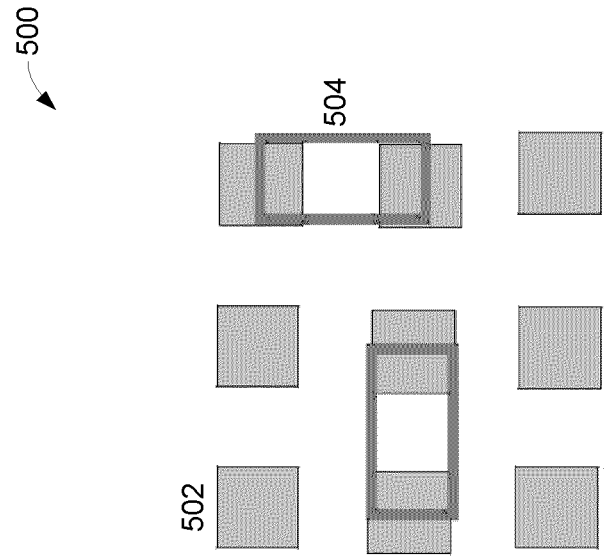

FIG. 5 illustrates one embodiment of the invention 500 showing patterns on a PCB. Here there is a 3×3 array of pads (such as 502) and a component (such as 504) shown. In one position component 504 is horizontally oriented and in another vertically oriented. In this embodiment, the pads are square-shaped and they are placed substantially in a rectangular (or square-shaped) pattern. For sake of illustration only the outline if component 504 is shown so that the placement with respect to patterns 502 may be more clearly seen.

Figure 6:
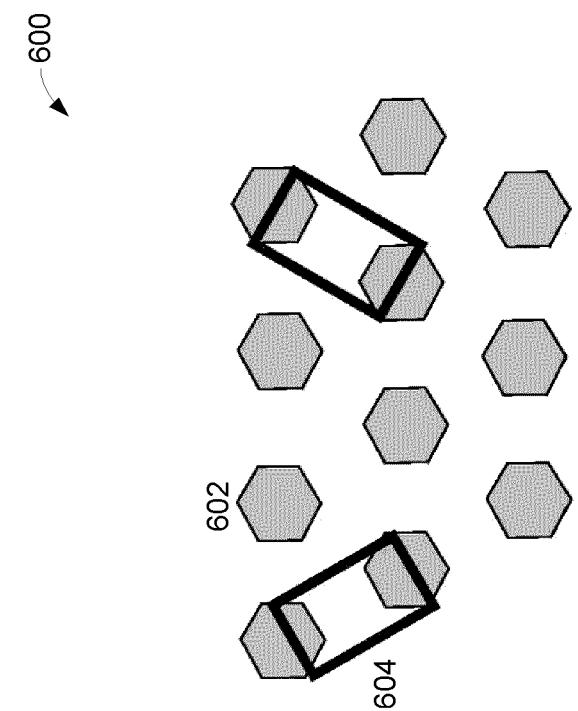
FIG. 5 and FIG. 6 illustrate embodiments of the invention showing patterns on a PCB.

FIG. 6 illustrates one embodiment of the invention 600 showing patterns on a PCB. Here there are 11 pads (such as 602) and a component (such as 604) shown. The pads are hexagonal in shape the arrangement of the pads is hexagonal in shape. In one position component 604 is oriented 30 degrees counter-clockwise from a vertical, and in another 30 degrees clockwise from a vertical. For sake of illustration only the outline if component 604 is shown so that the placement with respect to pads 602 may be more clearly seen.

FIG. 5 and FIG. 6 illustrate how components may be placed in alternative positions. For example, chip resistors, including zero ohm jumpers, provide circuit flexibility. Chip resistors may be placed at different locations (X, Y, theta) with differing degrees of rotation. For manufacturing consistency the aspect of a chip resistor relative to the mating pads should be uniform. For example, this is shown in FIG. 5 where square pads are used when rotations are multiples of 90 degrees and in FIG. 6 where hexagonal pads are used when rotations are multiples of 60 degrees. One of skill in the art will appreciate that this approach may be extended to higher order polygons. For example, where an array of W pads would normally require that components be rotated by an angle of 360/W with respect to the previous pad, a specific pad shape of a regular polygon with W sides may be used. For example, where 5 pads are needed, and each may be rotated by 360/5 degrees, or 72 degrees.

FIG. 4, FIG. 5, and FIG. 6 show component placement between two pads. This was for illustrative purposed only, however, the invention is not so limited and multiple components may by interconnected to provide greater flexibility and functionality. For example a 10-way switch.

Figure 7:
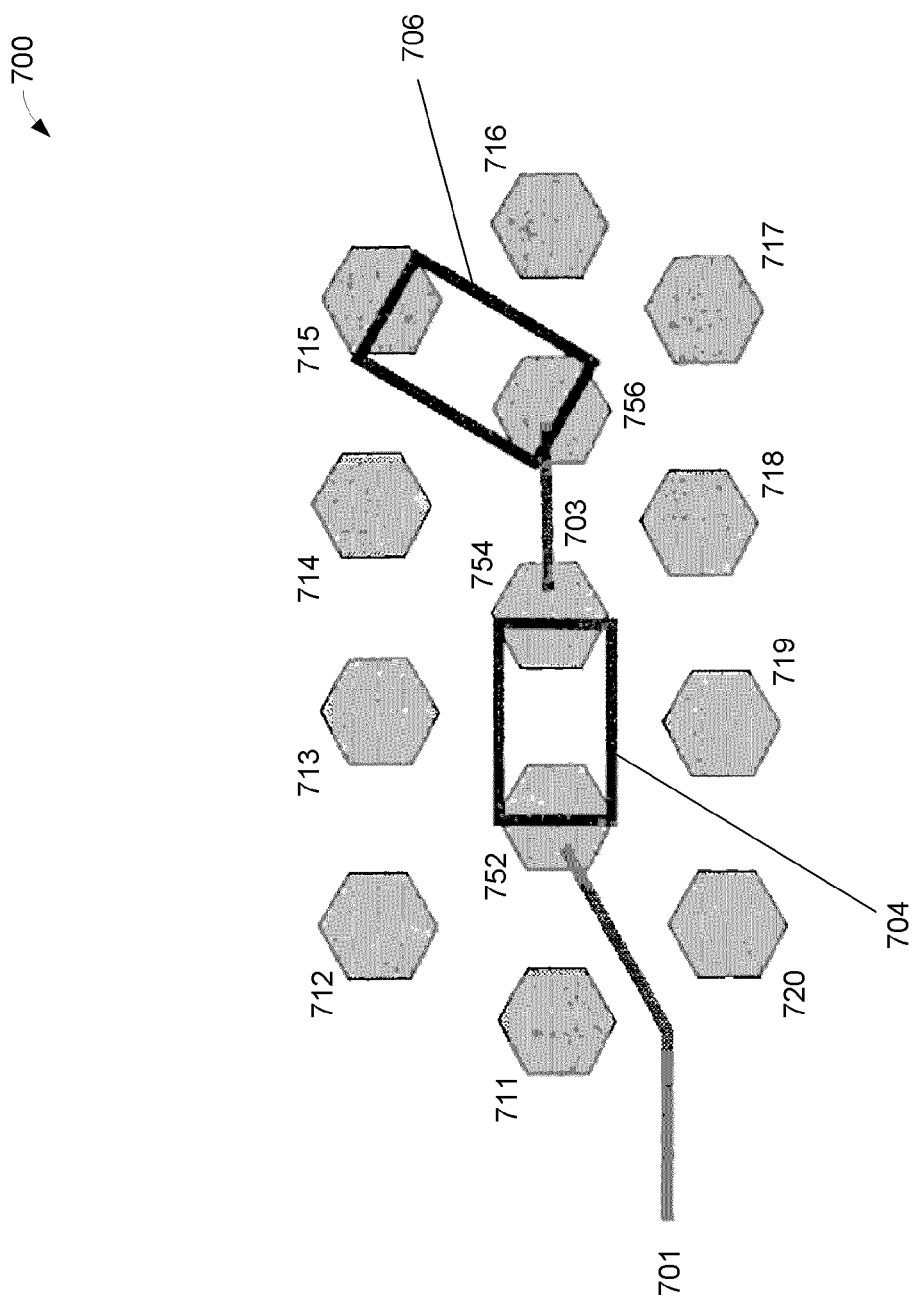
FIG. 7 illustrates one embodiment of the invention showing a 10 way switch based on hexagonal packing.

FIG. 7 illustrates one embodiment of the invention 700 showing a 10 way switch based on hexagonal packing. For sake of illustration assume that component 704 and 706 are zero ohm components. At 701 is a common terminal that depending on the placement of component 704 and 706 will connect to one of 10 terminals 711, 712, 713, 714, 715, 716, 717, 718, 719, 720. Common terminal 701 is a link connecting to pad 752. 703 represents a link connecting pads 754 and 756.

As illustrated in FIG. 7 a connection is made between 701 and 715. The connection is as follows: 701 is connected to 752, then through component 704, to 754, then through link 703 to 756, then from 756 through component 706 to 715.

For a 701 connection to one of the first three positions 711, 712, or 713, component 704 would be positioned from 752 to 711, 712, or 713 respectively. Since 704 is not in communication with 754, component 706 regardless of whether connected or not to 714, 715, 716, 717, or 718 will not make a connection with 701.

For a 701 connection to positions four through eight (714, 715, 716, 717, 718 respectively), component 704 would be positioned from 752 to 754, and component 706 would be positioned from 756 to 714, 715, 716, 717, 718 respectively.

For a 701 connection to positions 9 and 10 (719, 720 respectively), component 704 would be positioned from 752 to 719, or 720 respectively. Since 704 is not in communication with 754, component 706 regardless of whether connected or not to 714, 715, 716, 717, or 718 will not make a connection with 701.

One of skill in the art will appreciate that an N-way switch of any dimension may be constructed by adding more pads, links, and components. Additionally it is to be appreciated that if the switch is in one position, components may be placed on others as well. For example, in FIG. 7, components for circuitry may be placed, for example connecting 711 and 712, 719 and 718, etc.

Figure 8:
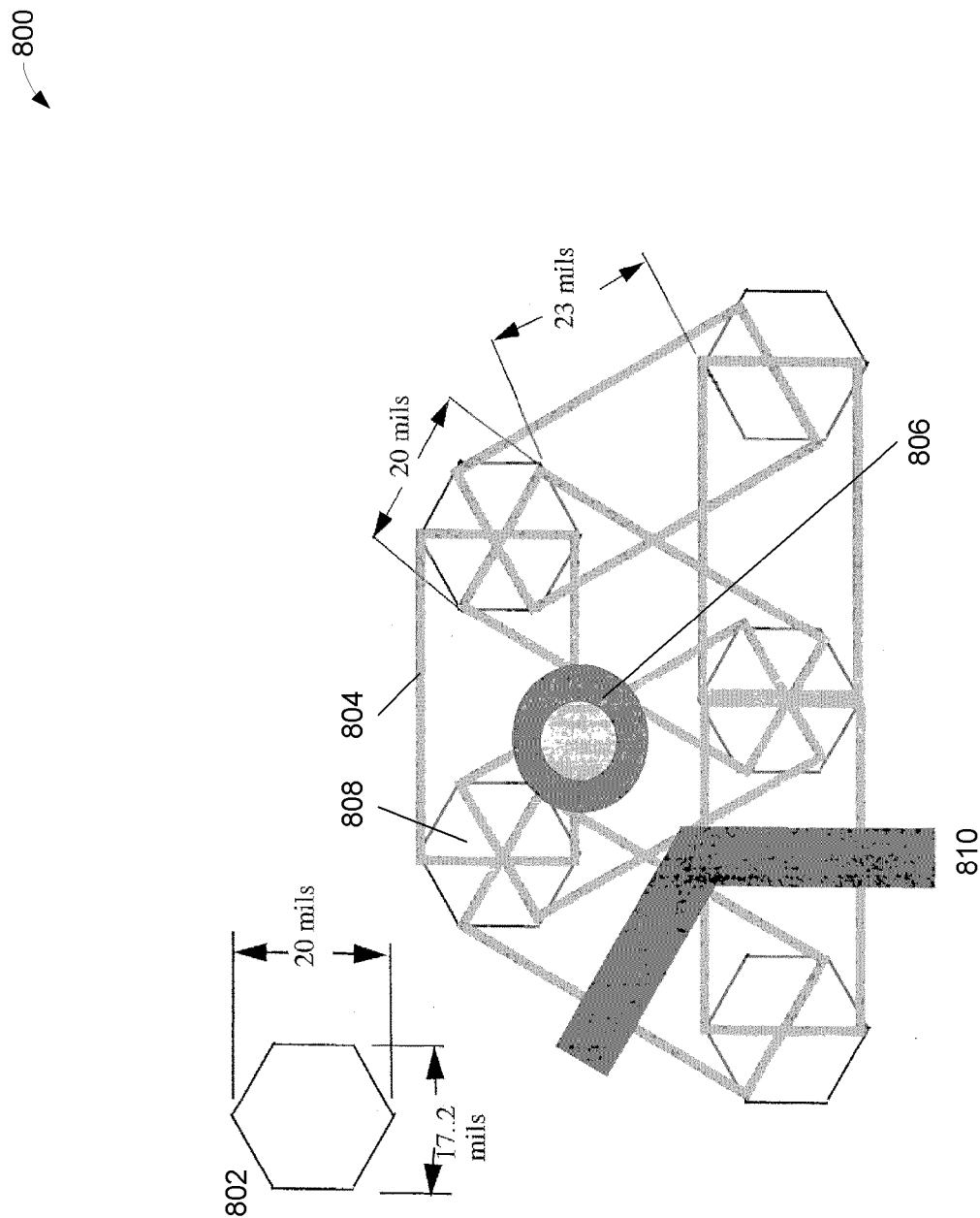
FIG. 8 and FIG. 9 illustrate embodiments of the invention showing details of pads, traces, and a via.

FIG. 8 illustrates one embodiment of the invention 800 showing details of pads, traces, and a via. At 802 is a hexagonal pad showing some dimensions suitable for a 0402 package size. A hexagonal arrangement of pads (such as 808) are shown. Outlines showing where components may be placed are outlined, such as 804. At 806 is a via (a through hole) which is in electrical, mechanical, and electrical contact with the pad labeled 808. Also shown for the array spacing is a trace 810 being routed between the pads.

Figure 9:
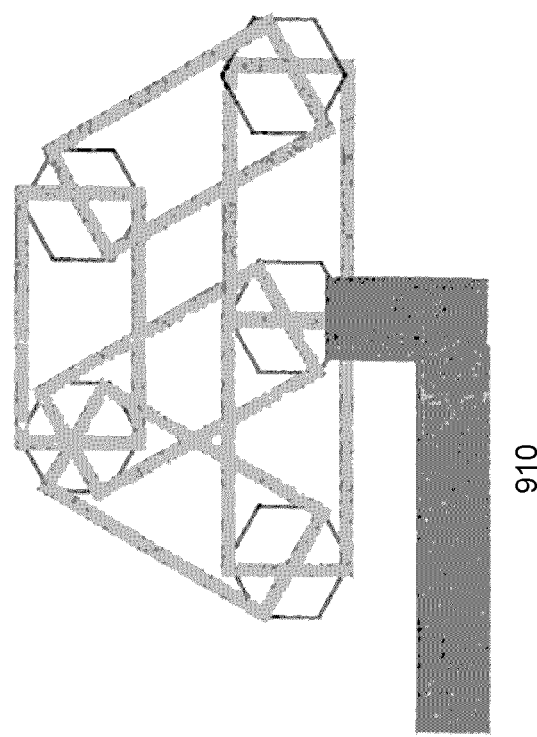

One of skill in the art will appreciate that the array may be sized to fit the trace widths and component sizes. For example, FIG. 9 illustrates one embodiment of the invention 900 showing a pattern, with a 6 mil (mil=0.001 inch) trace 910 connecting to a pad, which may be suitable for 0201 sized components.

Figure 10:
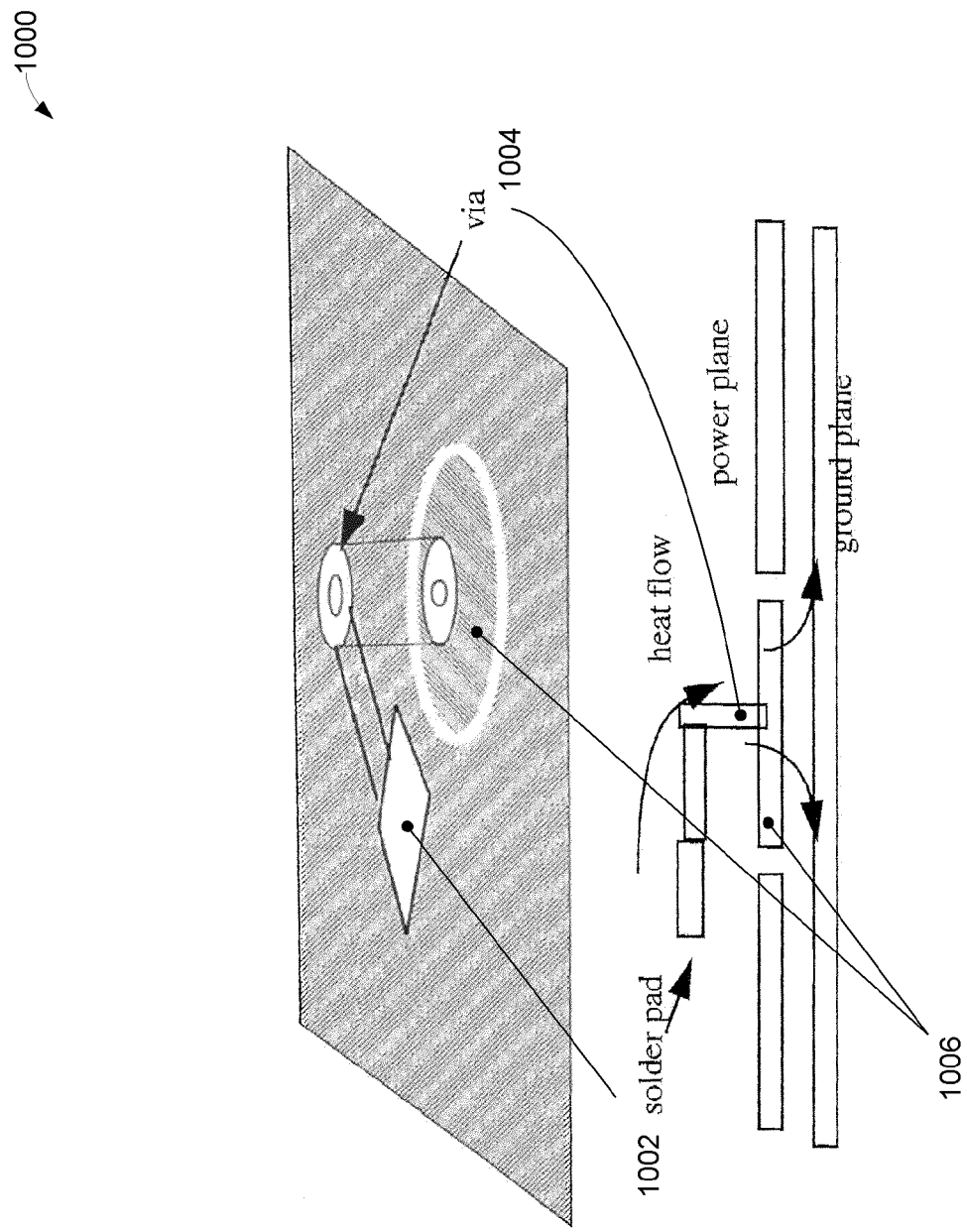
FIG. 10 illustrates one embodiment of the invention showing a perspective and side view of heat flow from a solder pad through a via to an isolated island.

FIG. 10 illustrates one embodiment of the invention 1000 showing a perspective view (top) and side view (bottom) of heat flow from a solder pad 1002 through a via 1004 to an isolated island 1006. Heat from the isolated island 1006 may then be spread to, in this example, the power and/or ground plane by thermal conduction. The island 1006 acts as a heat spreader effectively lowering the thermal resistance by having a larger surface area than the solder pad 1002 alone.

One of skill in the art will appreciate that by conducting heat away from components, such as chip resistors, the power dissipation of the component may be increased, possibly allowing the use of smaller components which may allow circuits to be smaller, possibly resulting in economic efficiency.

Figure 11:
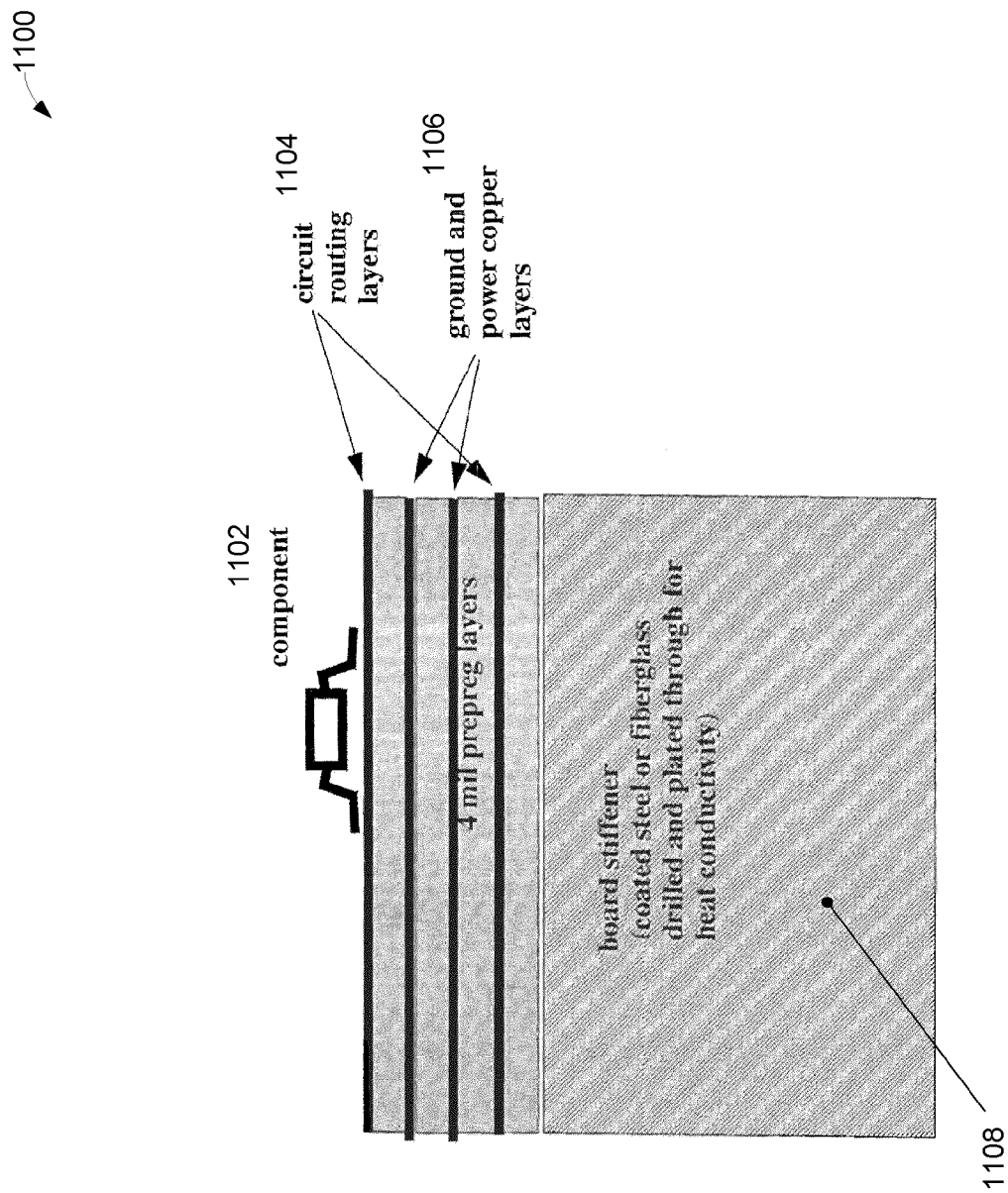
FIG. 11 illustrates one embodiment of the invention showing a PCB stackup.

FIG. 11 illustrates one embodiment of the invention 1100 showing a PCB stackup. Here at 1102 is shown a gull wing surface mount component. At 1104 are circuit routing layers, at 1106 are power and ground layers (planes), and 1104 and 1106 are shown separated by 4 mil prepreg (pre impregnated) layers. Also shown is 1108 a board stiffener that is bonded to the circuit board. As illustrated the board stiffener 1108 may be made of coated steel (such as copper, aluminum, etc.), or fiberglass (such as FR4) which has drilled and PTH (plated through holes) for increased heat conductivity (i.e. reduced thermal resistance).

One of skill in the art will appreciate that the PCB stackup as shown in FIG. 11 divides the PCB into active layers and a heat conductive stiffener. This stackup improves heat conduction from surface mount components to the heat dissipative ground and power planes by keeping the intervening layers of insulating fiberglass thin while still preserving board stiffness provided by the stiffener. The heat conductive properties may allow the use of smaller components that may contribute to economic feasibility.

Figure 12:
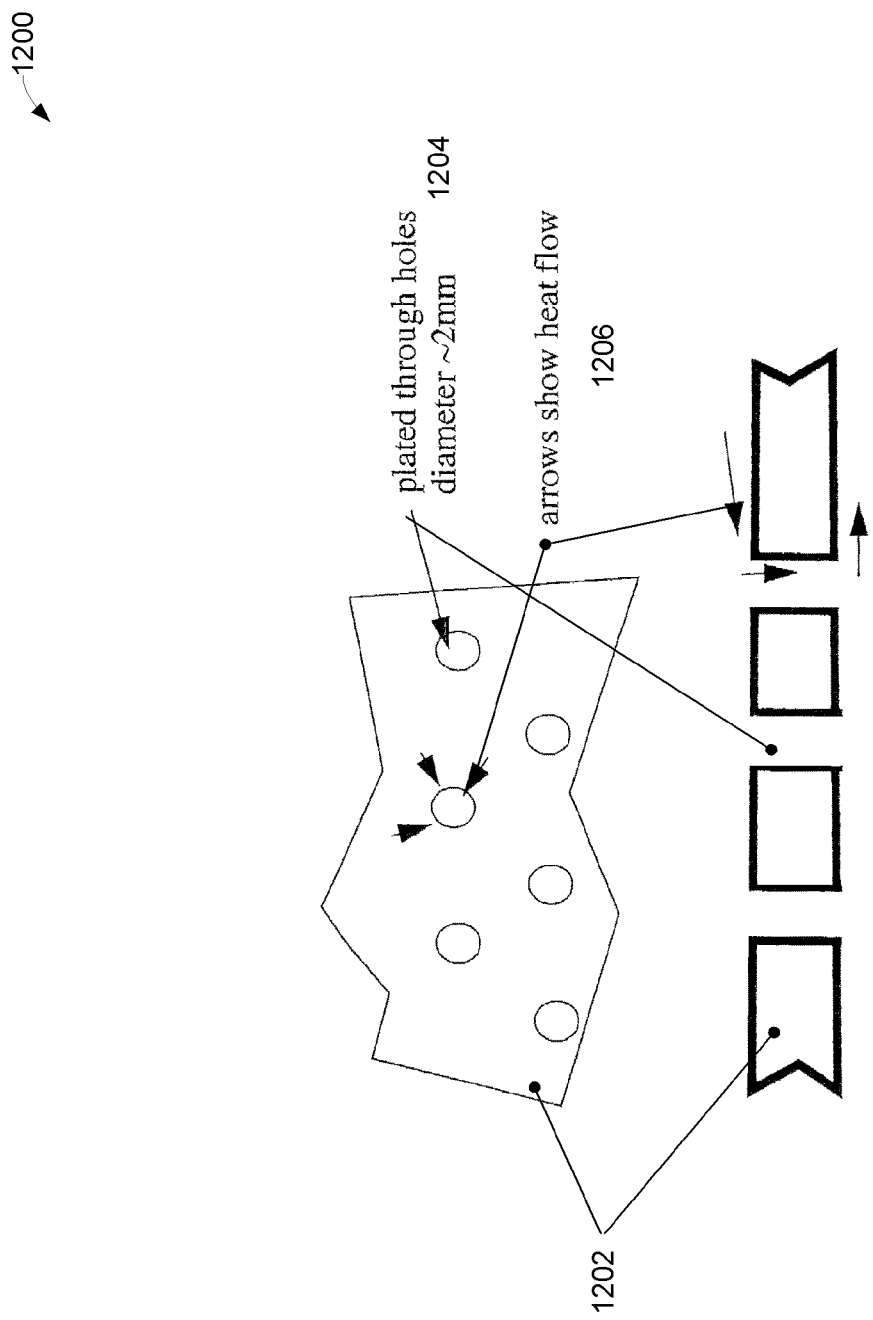
FIG. 12 illustrates one embodiment of the invention showing a board stiffener.

FIG. 12 illustrates one embodiment of the invention 1200 showing a board stiffener 1202. The top view (top diagram) of board stiffener 1202, shows plated through holes 1204, and arrows 1206 showing heat flow. In the lower diagram is a side view of board stiffener 1202, showing plated through holes 1204, and arrows 1206 showing heat flow. For example, the board stiffener may contain twenty 2 mm in diameter copper plated holes per square inch. The plated through holes, having a metallic lining, greatly increases the thermal conductivity of the board stiffener.

Figures 13A, 13B, 13C, 13D:
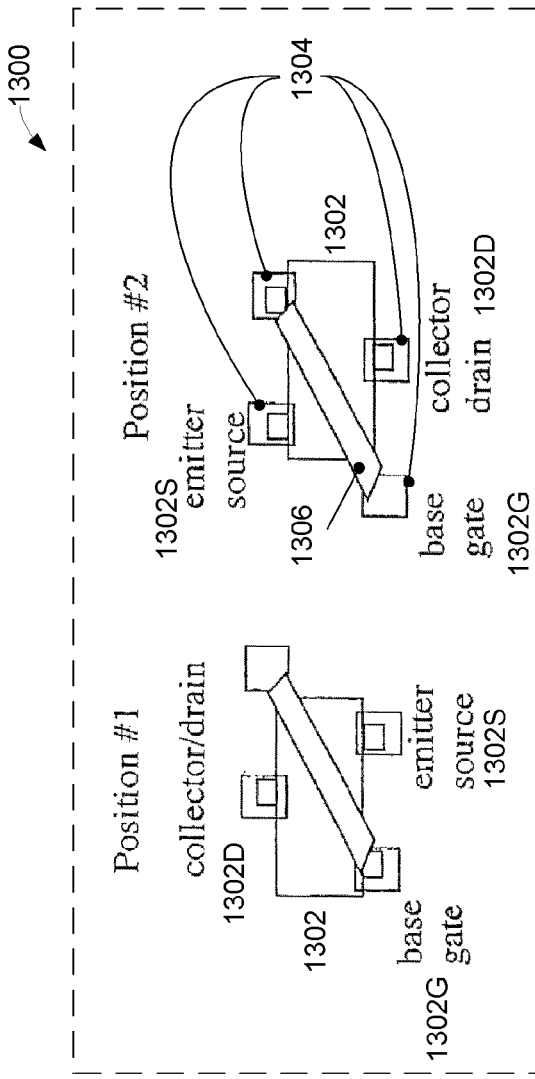
FIG. 13A, FIG. 13B, FIG. 13C, and FIG. 13D illustrate an embodiment of the invention.

FIG. 13A, FIG. 13B, FIG. 13C, and FIG. 13D illustrate an embodiment of the invention 1300. FIG. 13A shows component 1302 which is a SOT23 type package which may house a variety of different transistors. For convenience of discussion, component 1302 has 3 leads denoted 1302D, 1302S, and 1032G which may represent, depending upon the type of transistor, drain or collector, source or emitter, and gate or base respectively. At 1304 is a layout having 4 pads with a connection 1306 between two of the pads. At FIG. 13B the component 1302 is placed on the pads as indicated with the resulting connections, moving from center top clockwise, 1302D, 1302G (via 1306), 1302S, and 1302G. At FIG. 13C the component 1302 is placed as on the pads as indicated with the resulting connections, moving from center top clockwise, 1302S,1302G,1302D, and 1302G (via 1306). Thus, the placement of the component determines the connection. FIG. 13D illustrates schematically, the possible combinations possible with the placement.

FIG. 14A, FIG. 14B, FIG. 14C, and FIG. 14D illustrate an embodiment of the invention 1400, 1420, and 1430 respectively. FIG. 14A illustrates a 5 pad configuration 1404 having one of the pads connected to common 1406, two at G (Ground), one at first supply voltage, for example, +5V, and one at another supply voltage, for example, +24V. At FIG. 14B a component 1402, for example, a SOT23 package having two diodes is placed as shown. In this configuration the protective diodes in 1402 provide suppression of voltages dropping below ground and above +24V. At FIG. 14C a component 1402, for example, a SOT23 package having two diodes is placed as shown. In this configuration the protective diodes in 1402 provide suppression of voltages dropping below ground and above +5V. FIG. 14D shows schematically the circuit for the configurations in FIG. 14B and FIG. 14C. One of skill in the art will appreciate that other electrical or electronic devices may be in component 1402. For example, for static protection, back to back zener diodes may be in 1402 providing a connection between common 1406 and ground only.

Figure 15A:
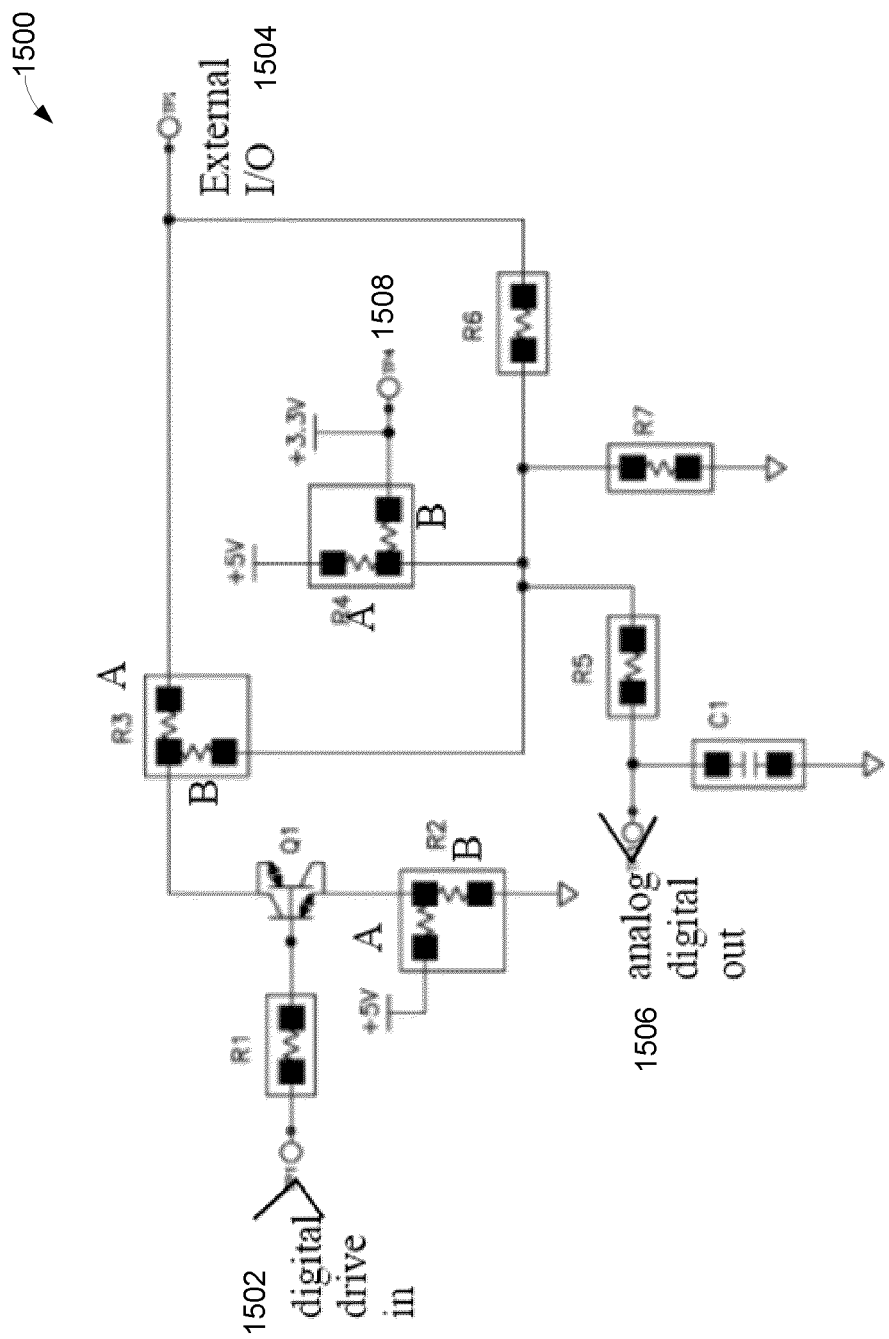
FIG. 15A and FIG. 15I illustrate embodiments of the invention in schematic form.

FIG. 15A illustrates one embodiment of the invention 1500 in schematic form. At 1502 is a digital input, at 1504 an external I/O, and at 1506 an analog or digital output, and at 1508 a test point. Also as indicated are positions for resistors: R1, R2A, R2B, R3A, R3B, R4A, R4B, R5, R6, R7; and capacitor: C1. Also shown are transistor: Q1, +5V, +3.3V, and ground.

Figure 15B:
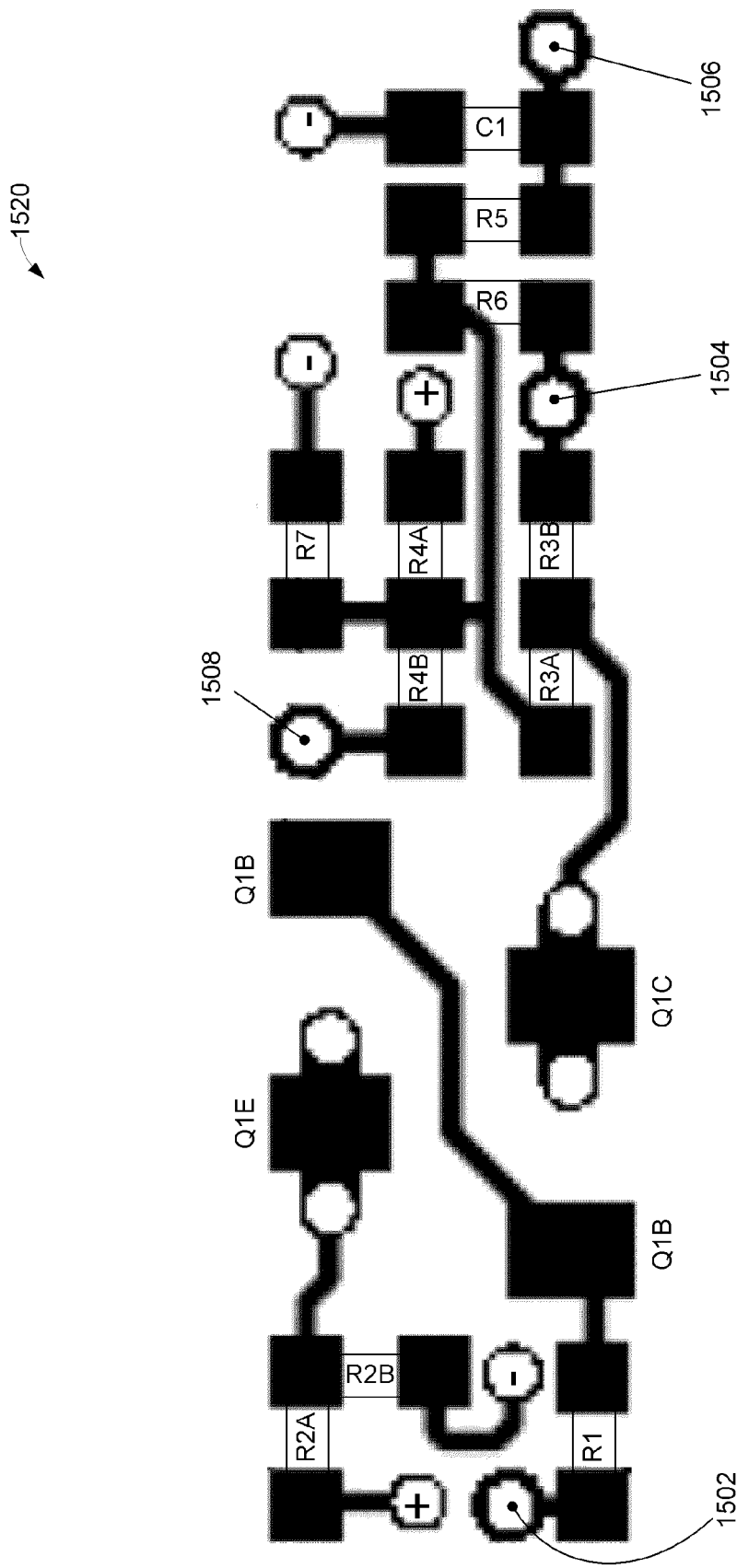
FIG. 15B illustrates one embodiment of the invention 1520 in the form of a layout on a PCB.

FIG. 15B illustrates one embodiment of the invention 1520 in the form of a layout on a PCB. At the locations indicated are where the schematic entries in FIG. 15A may be placed. A plus inside a trace denotes the +5V supply, and a minus inside a trace denotes ground. One of skill in the art will appreciate that many different PCB layouts are possible. For example, if resistive components can only be placed horizontally, then pads associated with R2B, R5, and R6 may be repositioned.

Figure 15C:
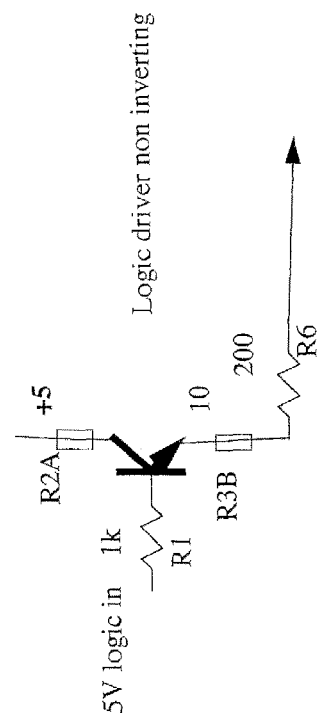
FIG. 15C, FIG. 15D, FIG. 15E, FIG. 15F, FIG. 15G, and FIG. 15H illustrate embodiments of the invention showing various components that may be placed in FIG. 15B.

FIG. 15C illustrates one embodiment of the invention showing various components that may be placed in FIG. 15B. The resulting circuit is a transmission line driver which may be used for an unterminated line. For example, the values noted are appropriate to drive a 100 ohm unterminated transmission line (shown by twisted wires).

Figure 15E:
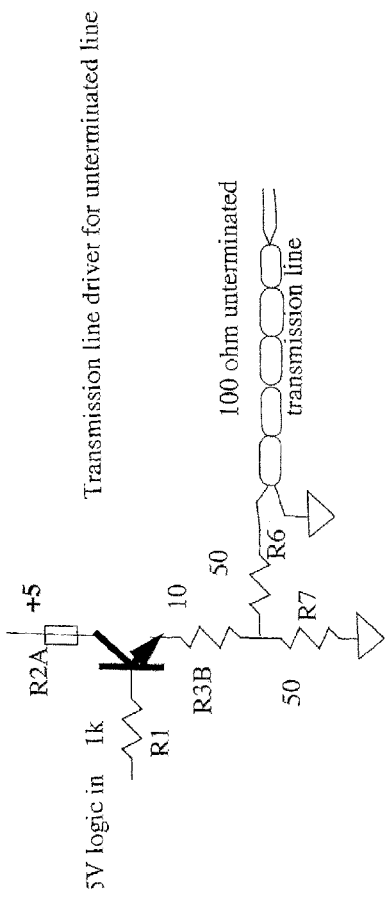
Figure 15D:
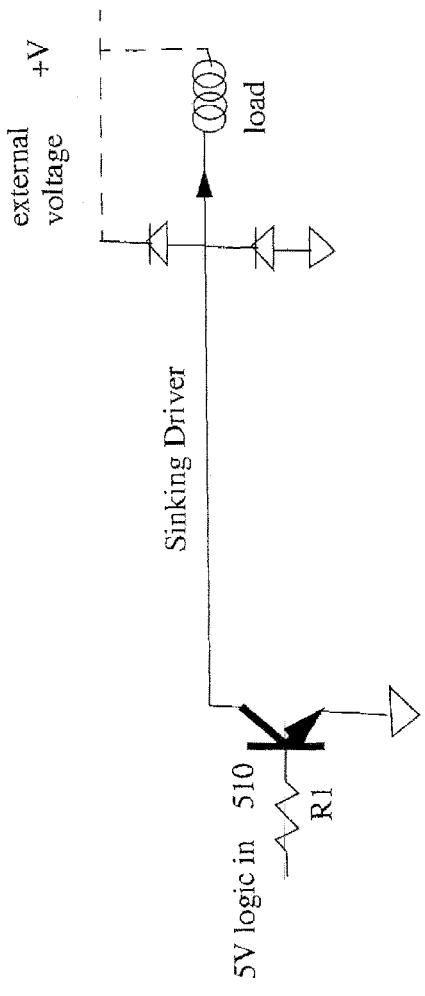

FIG. 15D illustrates one embodiment of the invention showing various components that may be placed in FIG. 15B. The resulting circuit is a non-inverting logic driver. Note that as illustrated, R2A is a low value (including 0 ohm) resistor.

FIG. 15E illustrates one embodiment of the invention showing various components that may be placed in FIG. 15B. The resulting circuit is an inverting logic driver using an open collector output.

Figure 15F:
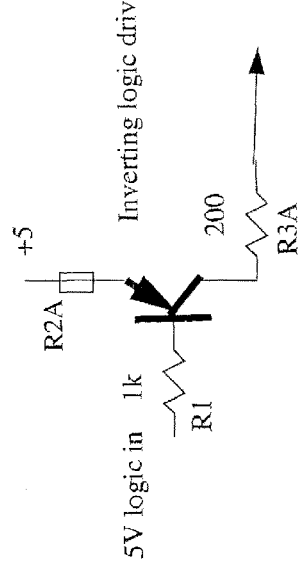

FIG. 15F illustrates one embodiment of the invention showing various components that may be placed in FIG. 15B. The resulting circuit is a sinking driver. As illustrated the driver may be connected to an inductive load, and so to absorb Ldi/dt spikes diodes are used.

Figure 15I:
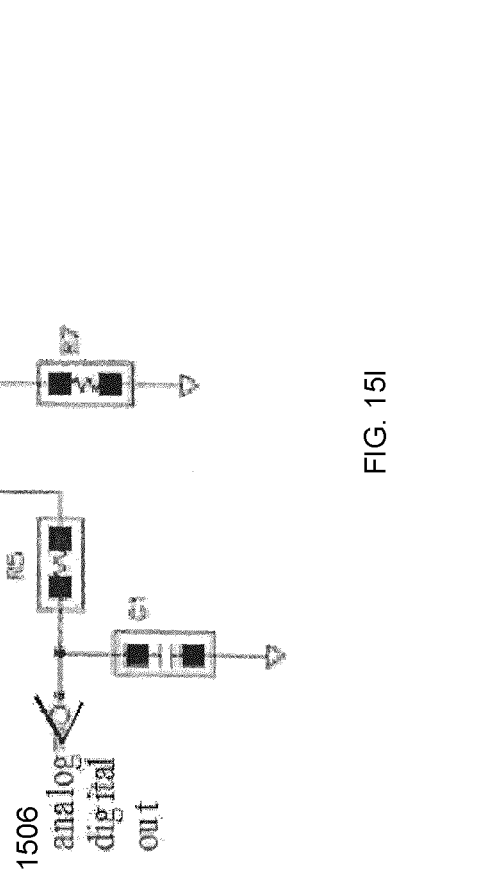

FIG. 15I illustrates one embodiment of the invention showing a portion of the schematic as shown in FIG. 15A. At 1504 is an external I/O, at 1506 an analog digital output, and 1508 a voltage supply.

Figure 15G:
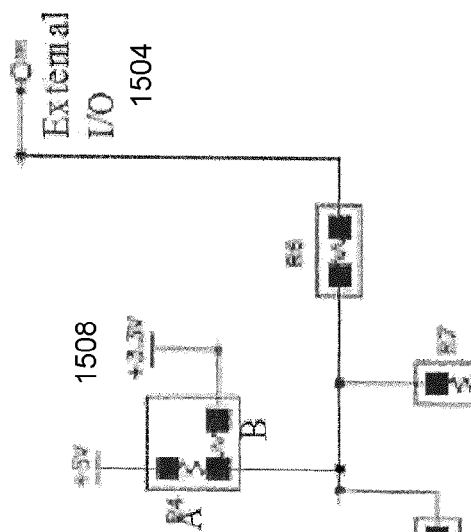

FIG. 15G illustrates one embodiment of the invention showing various components that may be placed in FIG. 15I. The resulting circuit is an input circuit with attenuation and filtering.

Figure 15H:
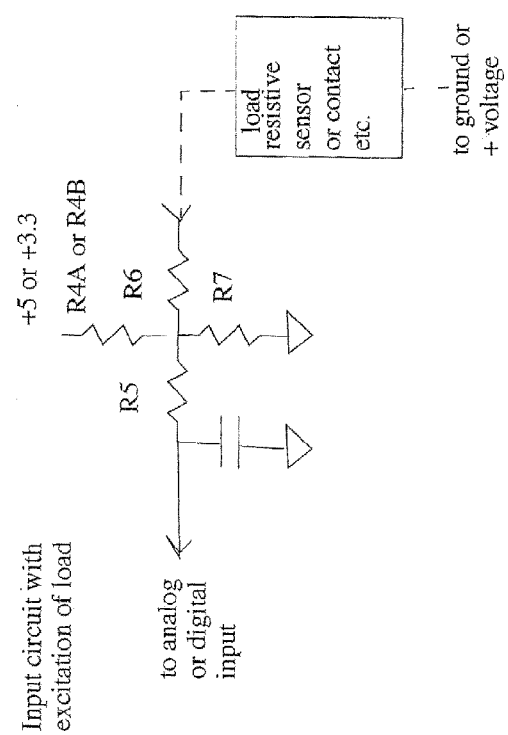

FIG. 15H illustrates one embodiment of the invention showing various components that may be placed in FIG. 15I. The resulting circuit is an input circuit with excitation of the load. For example, the load may be a switch, a sensor, etc.

Figure 16A:
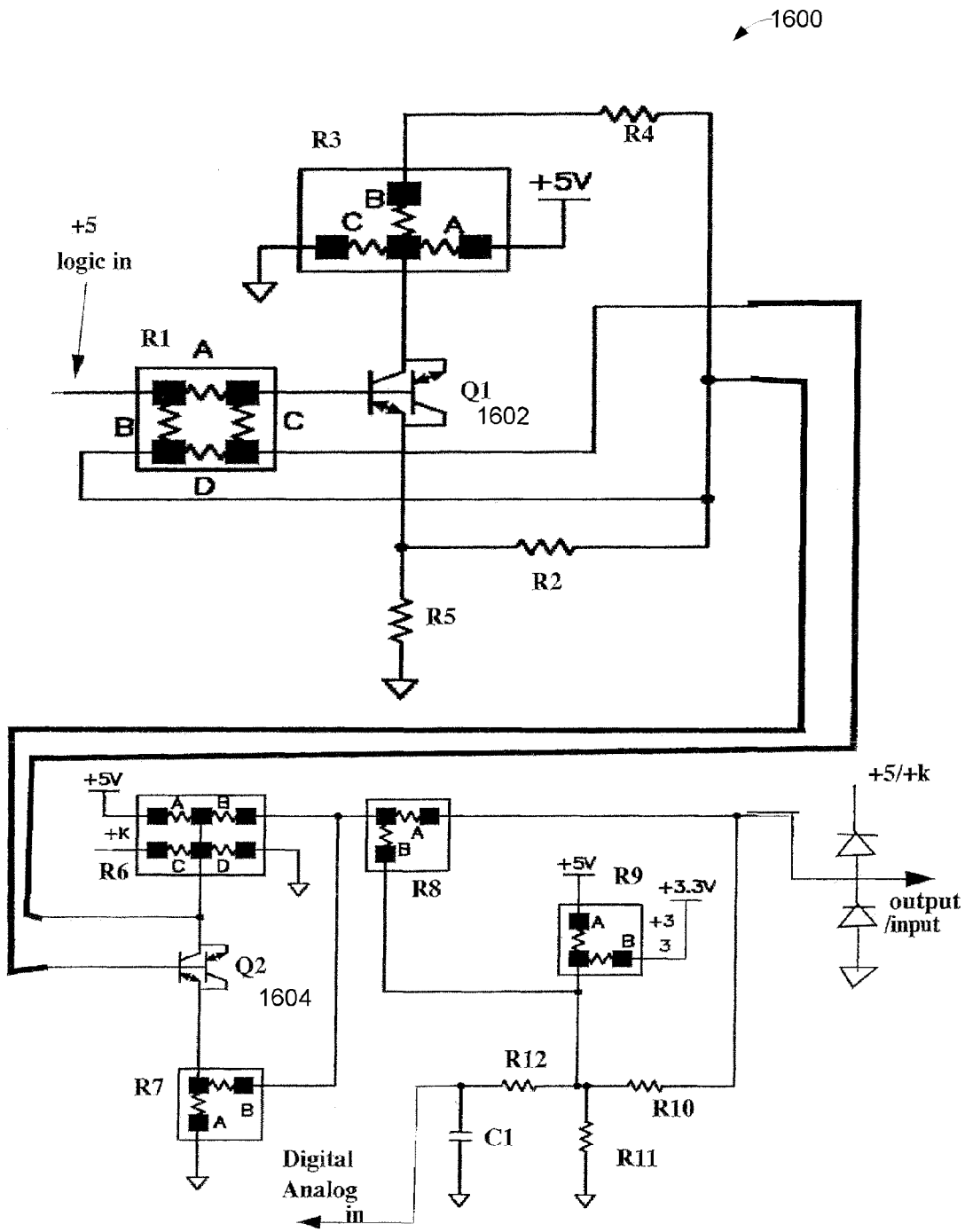
FIG. 16A illustrates one embodiment of the invention where the configurable circuitry has two transistors and other added components.

FIG. 16A illustrates one embodiment of the invention 1600 where the configurable circuitry has two transistors (Q1 at 1602, and Q2 at 1604) and other added components. One of skill in the art will appreciate that the present invention may use any number of components in a reconfigurable cell.

Figure 16B:
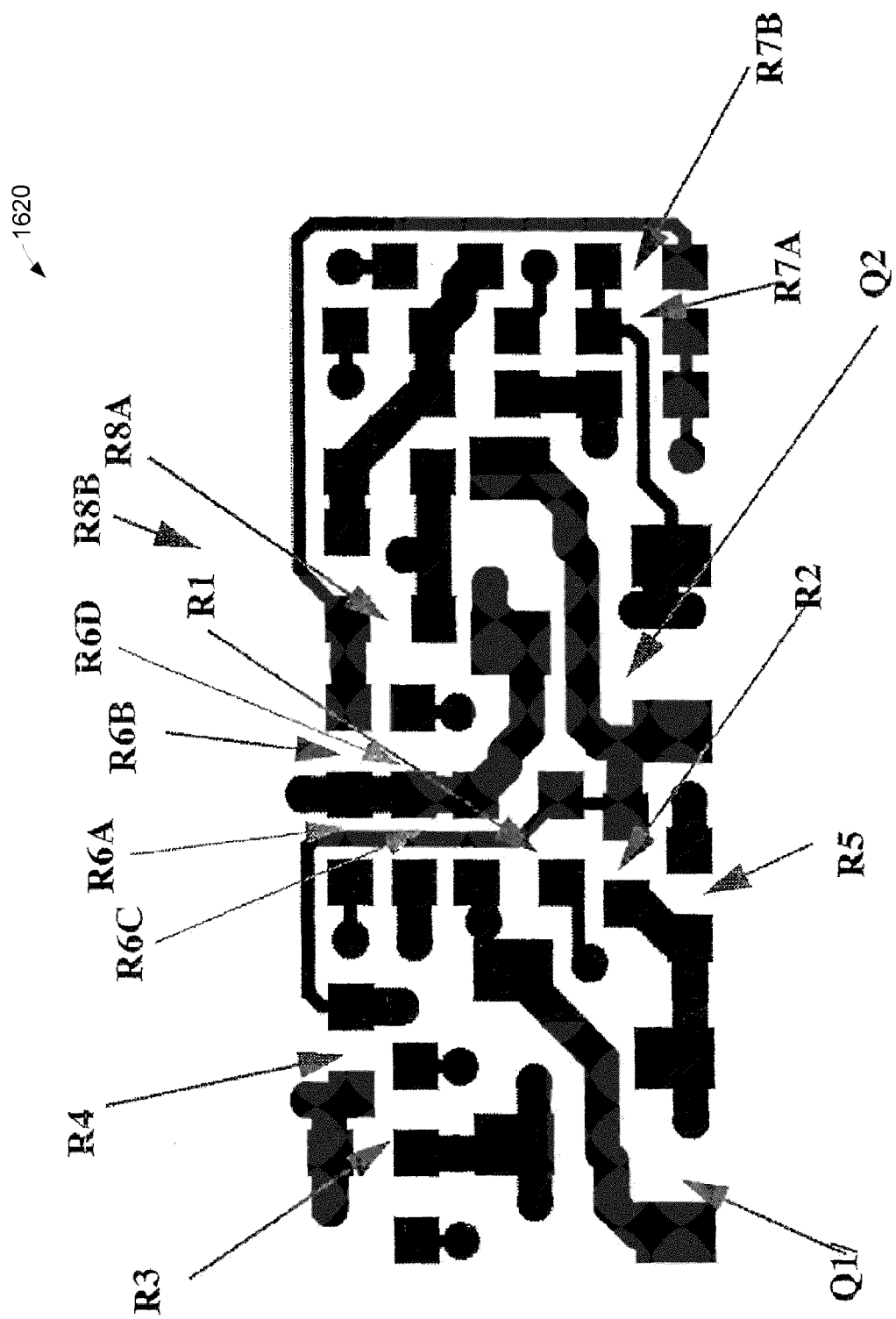
FIG. 16B illustrates one embodiment of the invention in the form of a layout on a PCB.

FIG. 16B illustrates one embodiment of the invention 1620 in the form of a layout on a PCB. At the locations indicated components correspond with the schematic entries in FIG. 16A. One of skill in the art will appreciate that many different PCB layouts are possible.

Figure 16C:
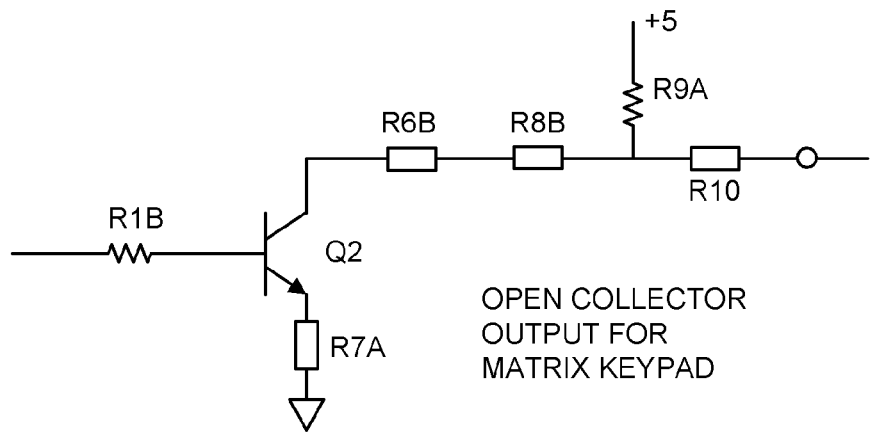
FIG. 16C, FIG. 16D, FIG. 16E, and FIG. 16F illustrate embodiments of the invention showing various components that may be placed in FIG. 16B.

FIG. 16C illustrates one embodiment of the invention showing various components that may be placed in FIG. 16B. The resulting circuit is an open collector output that may be used, for example, with a matrix keypad.

Figure 16D:
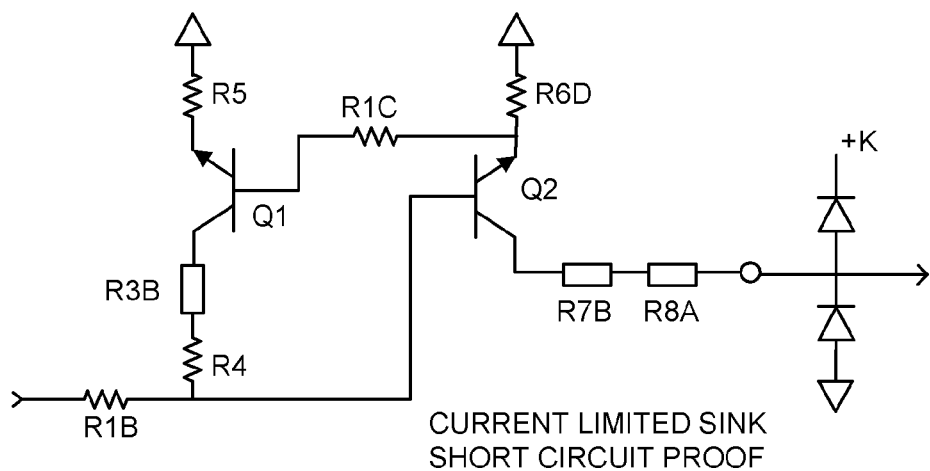

FIG. 16D illustrates one embodiment of the invention showing various components that may be placed in FIG. 16B. The resulting circuit is a current limited sink which is short circuit proof.

Figure 16E:
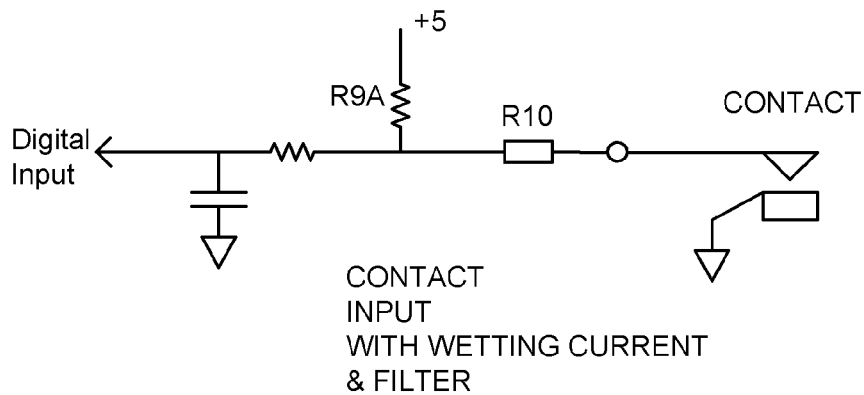

FIG. 16E illustrates one embodiment of the invention showing various components that may be placed in FIG. 16B. The resulting circuit is an input for a contact that provides a wetting current for the contact and an input filter.

Figure 16F:
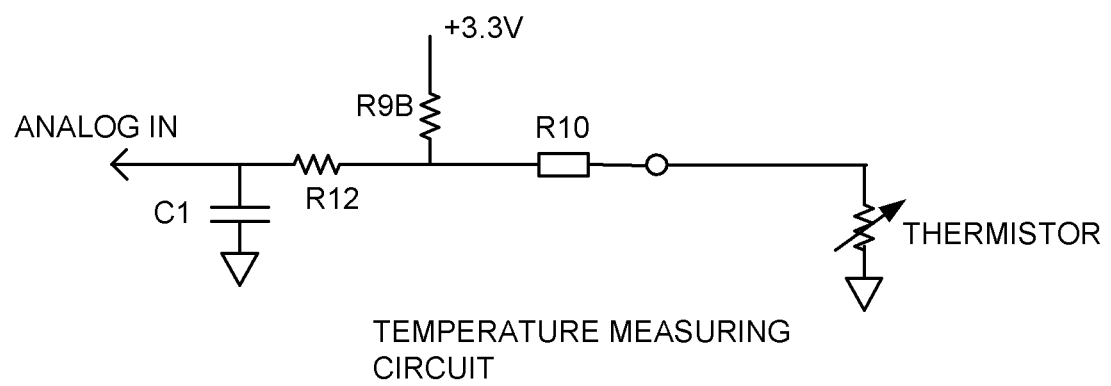

FIG. 16F illustrates one embodiment of the invention showing various components that may be placed in FIG. 16B. The resulting circuit is a temperature measuring circuit connected to a thermistor.

Figure 17:
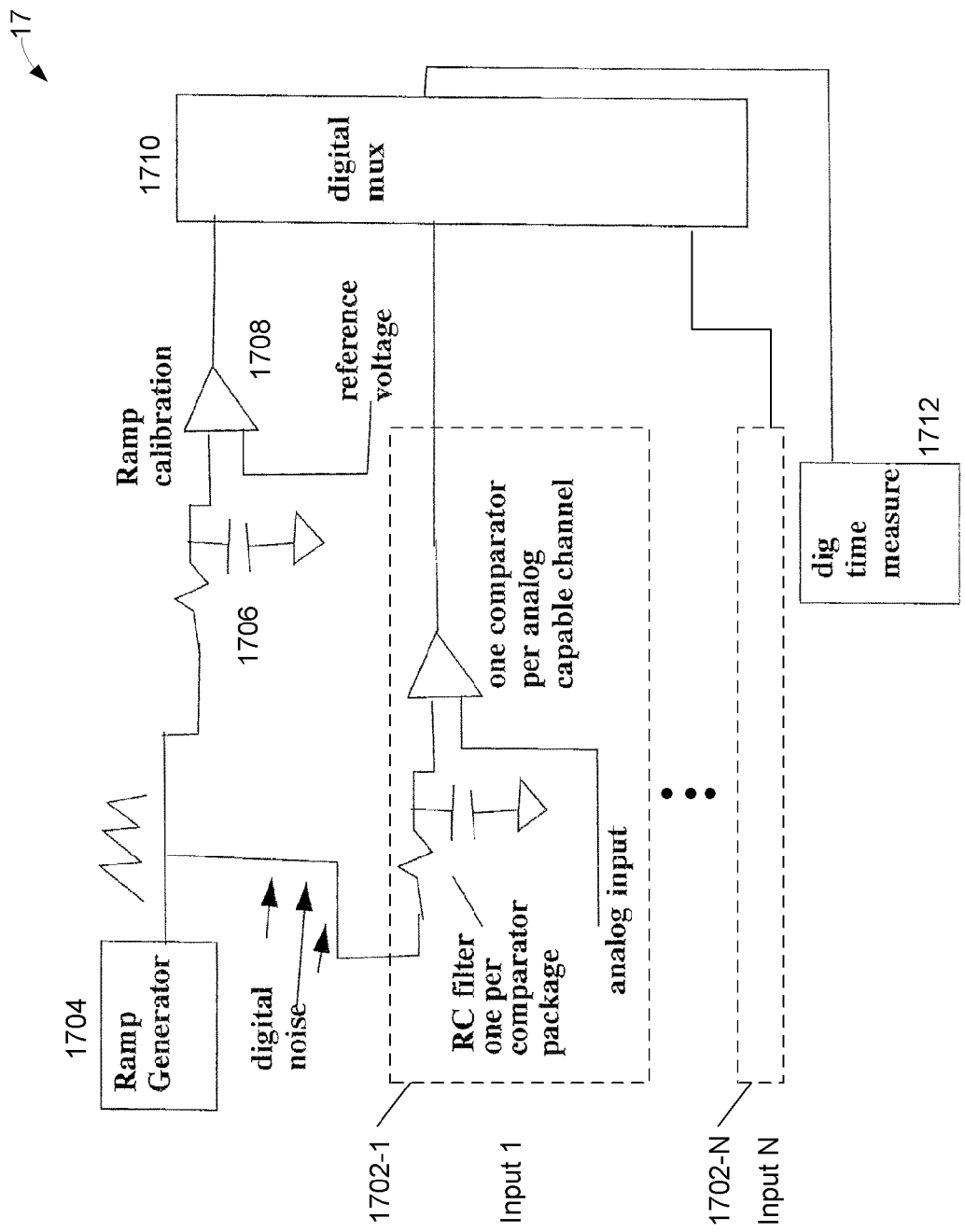
FIG. 17 illustrates one embodiment of the invention showing analog input sensing and A/D conversion.

FIG. 17 illustrates one embodiment of the invention 1700 showing analog input sensing and A/D conversion. At 1704 is a ramp generator outputting a signal. The ramp signal which may have digital and/or other noise on it is communicated to an RC filter 1706 at the front end of a ramp calibration comparator, and to 1 to N analog input (1702-1 to 1702-N). The filtered ramp signal goes into one input of a comparator in the ramp calibration comparator 1708, and one input of a comparator for each of the 1 to N analog inputs (blocks 1702-1 to 1702-N). For the ramp calibration the other input to the comparator 1708 is tied to a known reference voltage. For the 1 to N analog inputs (blocks 1702-1 to 1702-N) the other input to each comparator is tied to a respective analog signal to be sensed. All the comparator outputs are fed into a digital multiplexer 1710 the selectable output of which is connected to a digital time measurement unit 1712. By measuring the time for a comparator to "switch" state, it is possible to determine the analog voltage. The ramp calibration comparator 1708 provides a known reference for calibrating the count of a time measuring unit.

Figure 18:
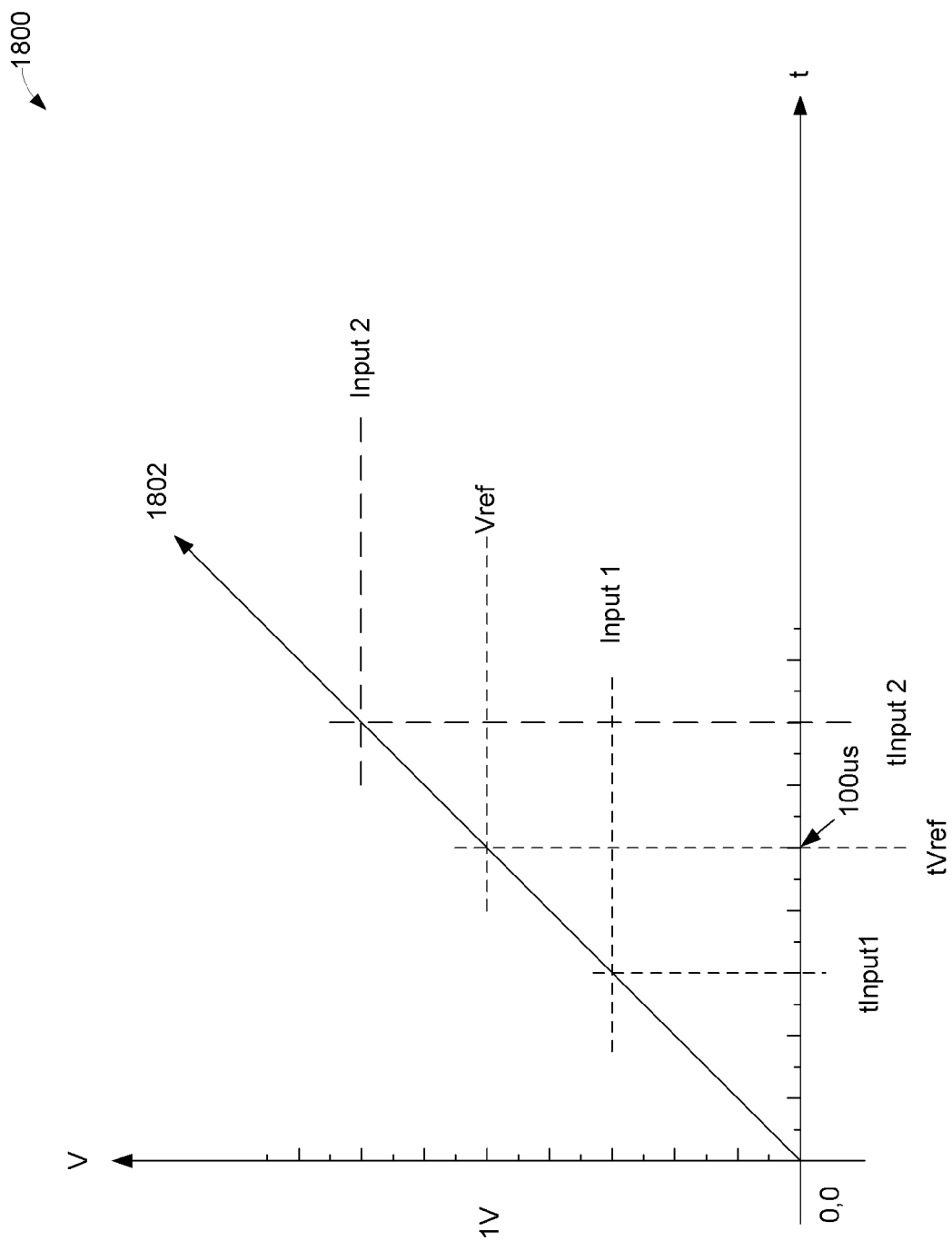
FIG. 18 and FIG. 19 illustrates embodiments of the invention showing how an embodiment of FIG. 17 may operate.

FIG. 18 illustrates one embodiment of the invention 1800 showing how an embodiment of FIG. 17 may operate. For sake of discussion the vertical axis represents a voltage, the horizontal axis time and starting at 0V and 0 sec is a ramp 1802, such as may be generated by the ramp generator 1704 in FIG. 17. Vref represents a reference voltage such as that in FIG. 17, and Input 1 and Input 2 represent analog inputs. As the ramp 1802 rises comparators will switch state based on the input voltages. The comparator associated with Vref in FIG. 18 switches at 1V and the time to switch is tVref as illustrated at 100 microseconds. With the 1V at 100 us as a known point, a microprocessor could easily calculate that since tInput1 is 60 us that the analog Input 1 voltage is 0.60V. Likewise the tInput2 being at 120 us relates to Input 2 being a 1.2V signal. For illustration purposes only the ramp 1802 is shown as linear. One of skill in the art will appreciate that with a known waveform, such as an RC curve, a microprocessor can calculate the voltage knowing the waveform. Additionally, one of skill in the art will appreciate that a time measurement may be made by "gating" a known frequency source and counting the resulting cumulative count. For example, 100 counts of a 1 MHz clock is 100 us.

Figure 19:
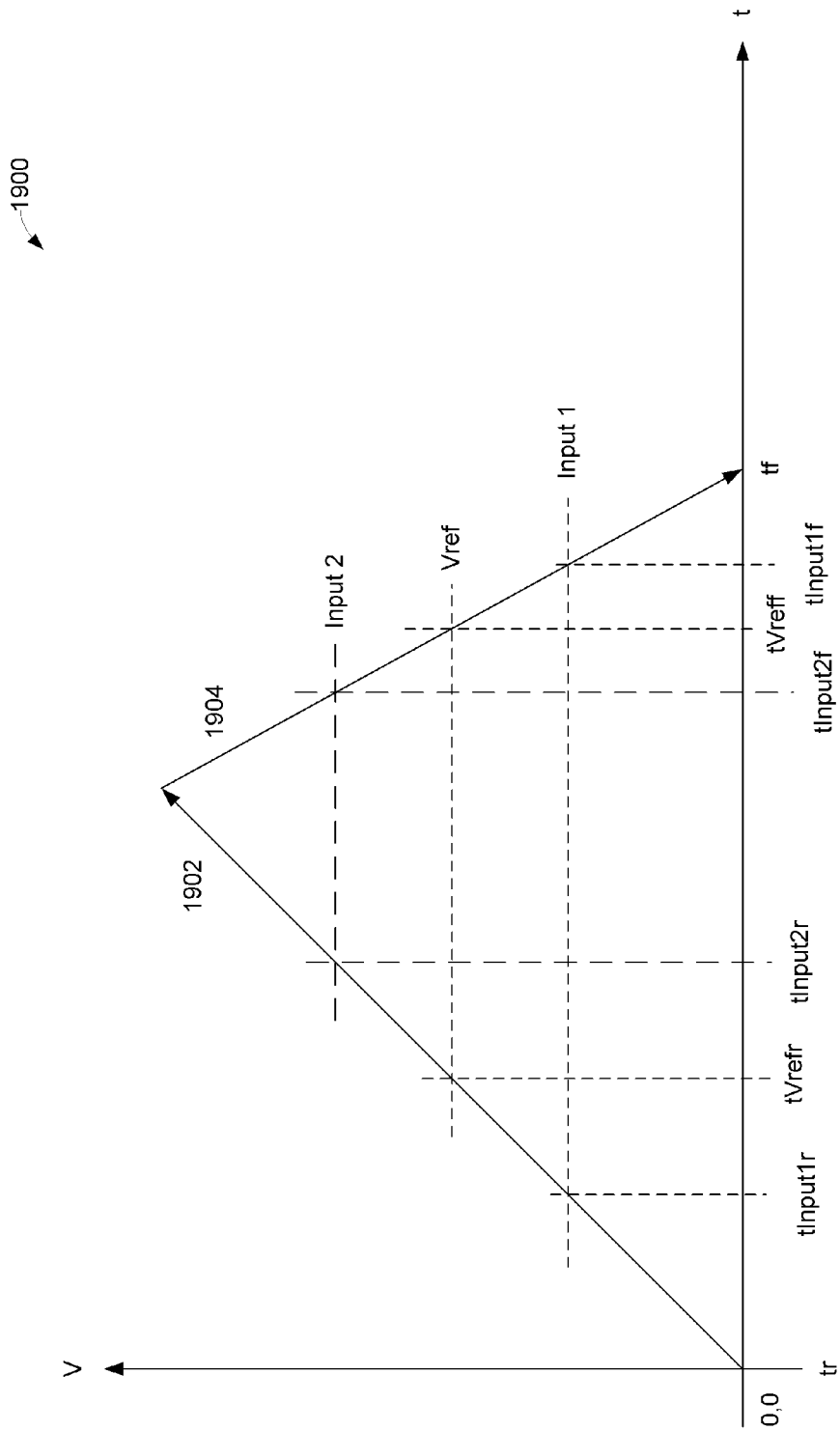

FIG. 19 illustrates one embodiment of the invention 1900 showing how an embodiment of FIG. 17 may operate. For sake of discussion the vertical axis represents a voltage, the horizontal axis time and starting at 0V and 0 sec is a rising ramp 1902, such as may be generated by the ramp generator 1704 in FIG. 17. Additionally a falling ramp 1904 is shown as may be generated by the ramp generator 1704 in FIG. 17. Vref represents a reference voltage such as that in FIG. 17, and Input 1 and Input 2 represent analog inputs. As the ramp 1902 rises comparators will switch state based on the input voltages and as ramp 1904 falls comparators will switch state. Based on the resulting switching times of the comparators, the voltages may be derived. For illustration purposes only the ramp 1902 and 1904 are shown as linear. One of skill in the art will appreciate that with a known waveform, such as a sawtooth, a microprocessor can calculate the voltage knowing the waveform. Additionally, one of skill in the art will appreciate that a time measurement may be made by counting pulses from a known frequency source during an interval.

Vref as used in any analog conversion may limit the resolution of the measurement. In one embodiment of the invention, Vref need not be an absolute value, but may be a known accurate value. Thus Vref may be measured at testing time and its value or a compensation value may be stored, for example, in non-volatile memory such as flash.

Figure 20:
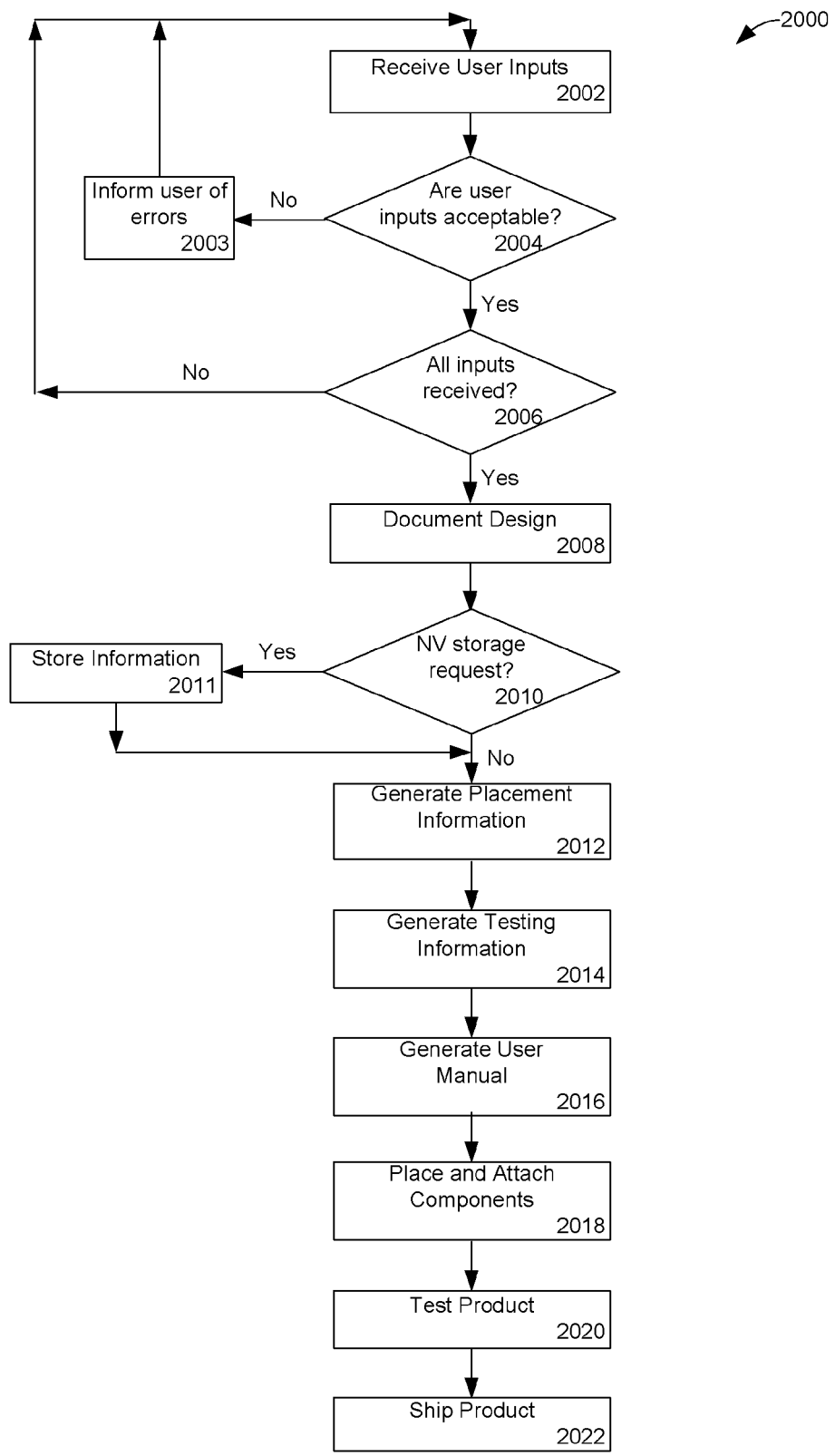
FIG. 20 illustrates one embodiment of the invention showing a process flow.

FIG. 20 illustrates one embodiment of the invention 2000. At 2002 inputs from the user are received and at 2004 the user inputs are checked to see it they are acceptable. If the inputs are not acceptable than at 2003 information is presented to the user so that they may provide acceptable inputs. If the inputs are acceptable at 2004 then at 2006 a check is made to see if all inputs have been received. If not then more inputs (at 2002) may be input. If all inputs have been received (at 2006) then at 2008 the design based on the user inputs (from 2002) is documented. At 2010 a check is made to see if any of the user inputs requested non-volatile (NV) storage of any of the inputs, such as, for example, names of I/O ports, mnemonics, URL addresses, passwords, user names, etc., and if so then at 2011 the information is stored, in for example, a flash memory on a microprocessor or another component on a board, such as a flash BIOS (basic input output system). If there is no storage request, or after storing the information, at 2012 component placement information is generated based on the design which is based on the user inputs. At 2014 testing information is generated to test the resulting configurable circuitry. At 2016 a user manual incorporating the result of the configurable circuitry is documented in a user manual. At 2018 the components are placed and attached to the product. The product is then tested at 2020, and at 2022 the product is shipped.

One of skill in the art will appreciate that the sequence of operations in FIG. 20 are illustrative and not limiting and may occur in different temporal sequence. For example, the user manual may be generated just before the product is shipped and after the product has been tested. Additionally, the user manual may be, for example, a PDF file that is immediately sent to the user after all inputs are received and before the product is manufactured.

Additionally, the non-volatile storage at 2011 may be used for other purposes as well. For example, the customer may enter mnemonic names for each input or output and these mnemonic names may be saved in non-volatile memory, or in a computer database in an account belonging to the user, and subsequently used by the customer during the writing of code. In one embodiment, the customer may enter additional explanatory notes related to the design and to each input and output. These notes become a permanent part of the design specification and can be accessed as system documentation during servicing and monitoring of the product in operation. The information may also be stored in files where it may be accessible by a software (such as C) compiler or used by a developer/customer during the writing of code for the product. During testing of the product, calibration information about the product may be stored in on board non-volatile memory.

In one embodiment, the product may have its own operating system. The operating system can automatically make use of notes, instructions, customized input/output names and other information entered by the customer during the design phase. In this manner the condition of the product, used in say a remote system connected to the Internet, can be monitored over the Internet without writing any special software. The operating system may be loaded in non-volatile memory at the time of manufacture.

Figure 21:
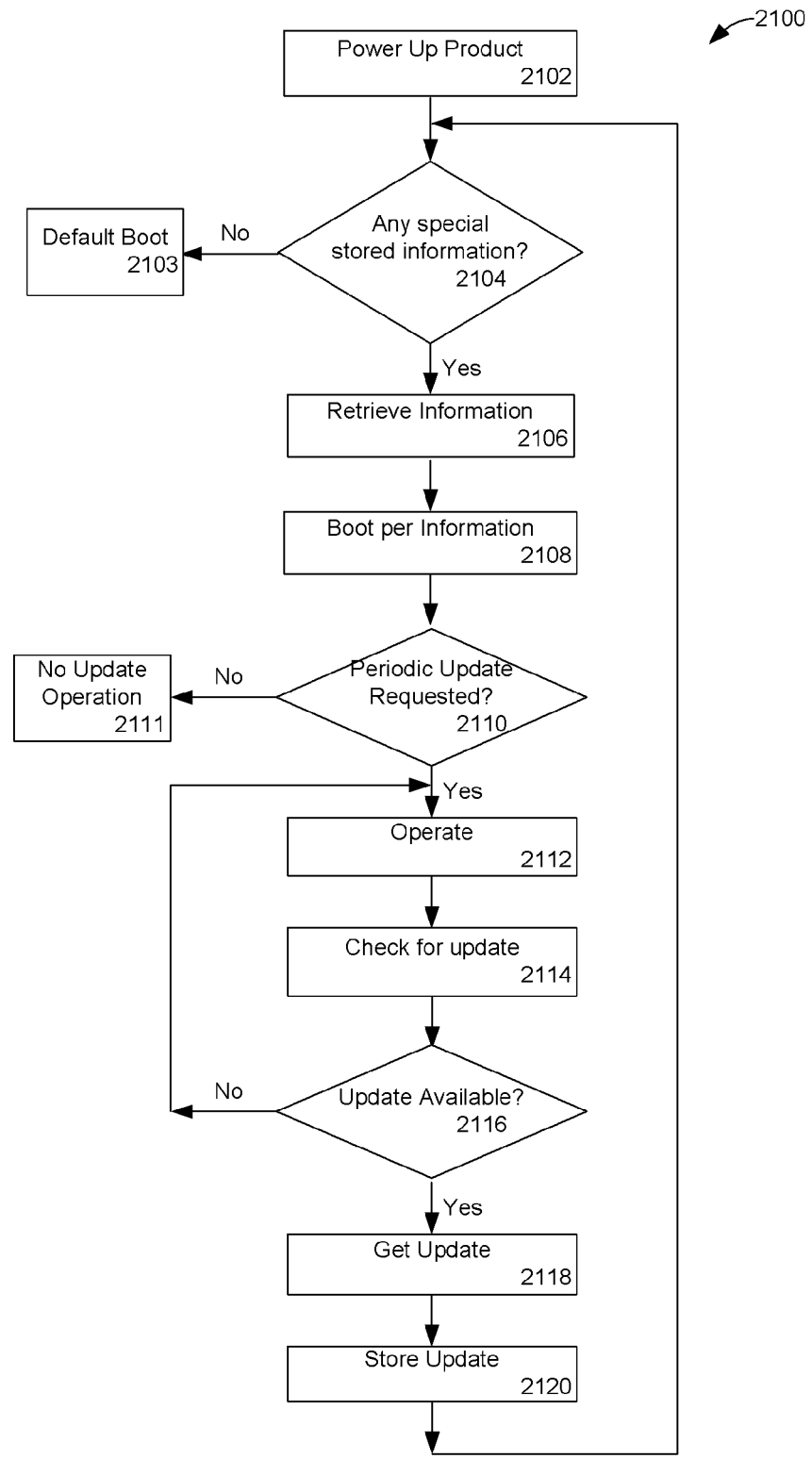
FIG. 21 illustrates one embodiment of the invention showing how non-volatile information may be used.

FIG. 21 illustrates one embodiment of the invention 2100 showing how non-volatile information, such as that at 2011 in FIG. 20, may be used. At 2102 the product is powered up. At 2104 a check is made to see if any special information, such as that stored at 2011 in FIG. 20, is available. If not then the product may boot with a default 2103. If special information is available then at 2106 the information is retrieved and at 2108 the product boots using the information. At 2110 a check is made to see if periodic updates have been requested, such as instructions in the special information. If no updates are requested then at 2111 operation in a no update mode is run. If periodic updates have been requested then the system operates 2112, and then checks for an update 2114. When to check for an update may be based on such things as, but not limited to, time, execution uptime, day of the week, being powered up or down, being connected to a network, etc. At 2116 if an update is not available then operation resumes at 2112. If an update is available then at 2118 the update is retrieved. After the update is stored at 2120, operation begins again at 2104.

For example, in one embodiment, the product may be shipped to an end user site, connected to a corporate network that is connected to the Internet, and then automatically loaded with software by automatically downloading the software from the Internet. In this embodiment, the information loaded into the non-volatile memory at the factory will have the capability to store instruction and information such as network location (for instance a URL or IP address) entered by the customer so that it may access the network location later and automatically download necessary software and/or software updates. In this way, the product can install itself, including the necessary application software, and subsequently periodically check the web site or other locations for software updates. This may be accomplished by a web utility that maintains separate accounts for different customers or products and which can be accessed by the product.

While the above discussion of embodiments of the present invention have used solder pads and SMT (surface mount technology), one of skill in the art will appreciate that other device connection technologies are also applicable. For example through hole, and PTH (plated through hole) technology and components may also be configured to provide customizable circuitry. Additionally, the invention is not so limited and a combination of SMT and through hole technologies may be used.

Use of the term "solder pads" or similar language is for convenience is not to be interpreted to limit the present invention to the use of "solder." Other connection technologies, such as welding, adhesive bonding, and other approaches may be used. Current trends in the industry are to try and limit the use of lead and so, as used in this description, solder pads refers to a connection point for component connection.

Additionally, while the description, for sake of illustration, showed only a single side of a PCB being used, the invention is not so limited and use of components on both sides, or even within (for example via resistors) a PCB are possible. For example for a configurable circuit such as that illustrated in FIG. 16A may have part of the components located on one side of a PCB the rest on the other side. So, for example, in FIG. 16A the top half of the circuit (above the 2 parallel horizontal lines) may be on one side of the PCB with the lower half of the circuit (below the 2 parallel horizontal lines) may be on the other side of the PCB.

One of skill in the art will appreciate that the techniques described may be extended to handle larger or smaller components, lower power or higher power components, etc.

Additionally, while separate input and output functions have been shown, the invention is not so limited and may have both inputs and outputs operational, providing for I/O functionality. Further digital and analog functionality may be practiced. Also control of AC voltages may also be achieved by, for example, using triacs, etc.

Circuitry as described above has been illustrated by electrical and electronic circuits using passive and active devices. The invention is not so limited. What is to be appreciated is that configurable connections are being made. Thus the techniques described are applicable to other fields, such as, but not limited to fluidics, optics, electronics, etc. For example fluidic components may be configured in a fixed set of "patterns" such that they may provide different functionality. Additionally there are many optical equivalents to electrical/electronic components and one of skill in the art will appreciate that their arrangement in a set of positions in an array will lead to different optical "circuits."

Thus a method and apparatus for configurable circuitry have been described.

FIG. 1 illustrates a network environment 100 in which the techniques described may be applied. The network environment 100 has a network 102 that connects S servers 104-1 through 104-S, and C clients 108-1 through 108-C. More details are described below.

Figure 2:
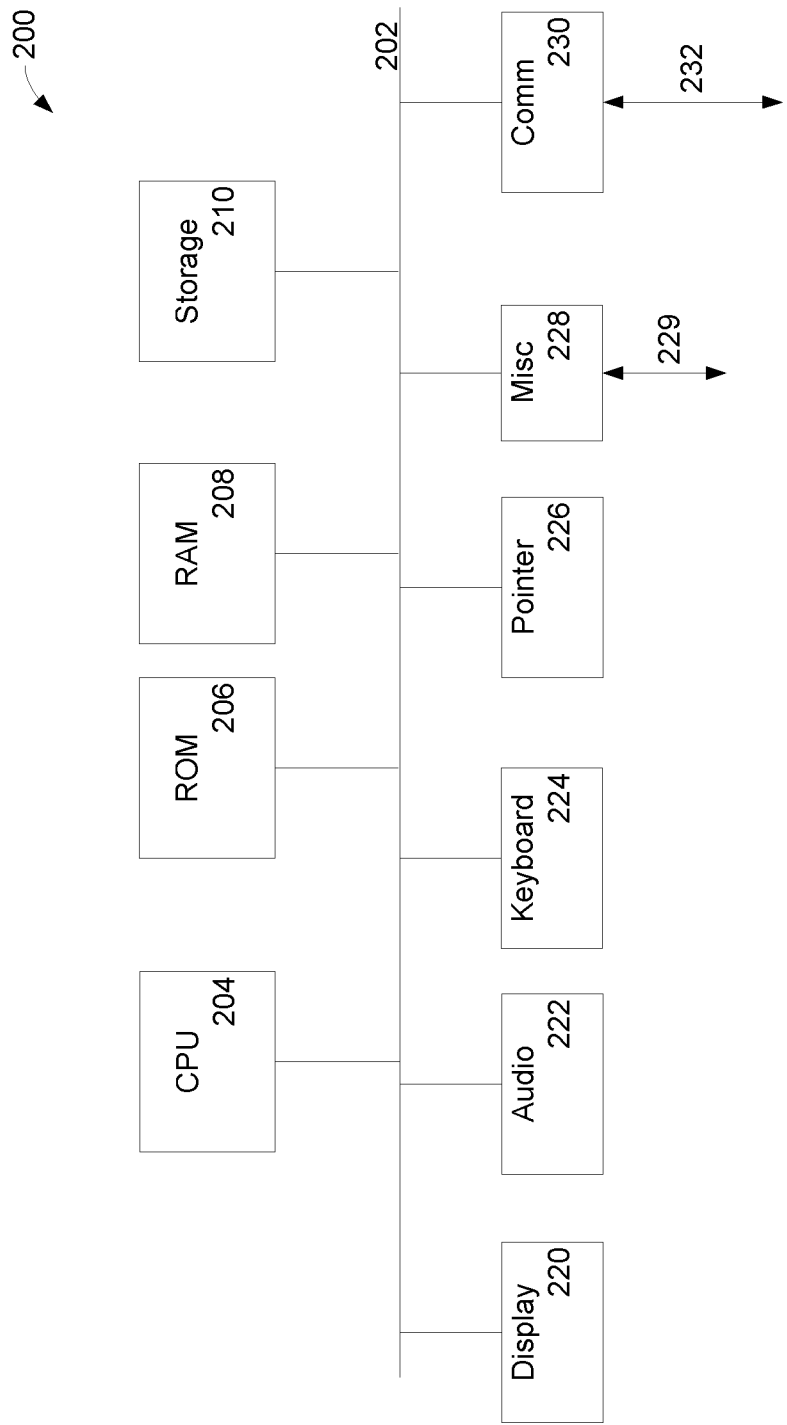
FIG. 2 is a block diagram of a computer system which may be used for implementing some embodiments of the invention.

FIG. 2 illustrates a computer system 200 in block diagram form, which may be representative of any of the clients and/or servers shown in FIG. 1, as well as, devices, clients, and servers in other Figures, and in which the techniques described may be applied. More details are described below.

Referring back to FIG. 1, FIG. 1 illustrates a network environment 100 in which the techniques described may be applied. The network environment 100 has a network 102 that connects S servers 104-1 through 104-S, and C clients 108-1 through 108-C. As shown, several computer systems in the form of S servers 104-1 through 104-S and C clients 108-1 through 108-C are connected to each other via a network 102, which may be, for example, a corporate based network. Note that alternatively the network 102 might be or include one or more of: the Internet, a Local Area Network (LAN), Wide Area Network (WAN), satellite link, fiber network, cable network, or a combination of these and/or others. The servers may represent, for example, disk storage systems alone or storage and computing resources. Likewise, the clients may have computing, storage, and viewing capabilities. The method and apparatus described herein may be applied to essentially any type of communicating means or device whether local or remote, such as a LAN, a WAN, a system bus, etc.

Referring back to FIG. 2, FIG. 2 illustrates a computer system 200 in block diagram form, which may be representative of any of the clients and/or servers shown in FIG. 1. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228, and communications 230. The bus system 202 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1394 (FireWire), Universal Serial Bus (USB), etc. The CPU 204 may be a single, multiple, or even a distributed computing resource. Storage 210, may be Compact Disc (CD), Digital Versatile Disk (DVD), hard disks (HD), optical disks, tape, flash, memory sticks, video recorders, etc. Display 220 might be, for example, a Cathode Ray Tube (CRT), Liquid Crystal Display (LCD), a projection system, Television (TV), etc. Note that depending upon the actual implementation of a computer system, the computer system may include some, all, more, or a rearrangement of components in the block diagram. For example, a thin client might consist of a wireless hand held device that lacks, for example, a traditional keyboard. Thus, many variations on the system of FIG. 2 are possible.

For purposes of discussing and understanding the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

As used in this description reference to "surface mount placement machine," or similar phrases refers to any device or mechanism or technique for placing components. The components need not be surface mount, and use of surface mount is for illustrative purposes only.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

Thus a method and apparatus for configurable circuitry have been described.

What is claimed is:

1. A printed circuit board comprising:
   one or more electrically conductive layers separated by one or more insulating layers; and
   a stiffener having a plurality of plated through vias, said stiffener non-electrically connectedly attached to said one or more electrically conductive layers separated by one or more insulating layers;
   wherein each of said plurality of plated through vias has an opening in a top of said stiffener and a corresponding opening in a bottom of said stiffener and wherein said opening in said top and said opening in said bottom are coaxially located along a single longitudinal axis, said single longitudinal axis extending from said top of said stiffener to said bottom of said stiffener, and wherein a plated through via extends from said top opening to said bottom opening coaxially along said single longitudinal axis;
   wherein one of said one or more electrically conductive layers is a topmost layer on said printed circuit board;
   wherein said topmost layer has one or more components mounted on it;
   wherein said one or more components mounted are in electrical connection with a circuit routing on said topmost layer.

2. A printed circuit board comprising:
   one or more electrically conductive layers separated by one or more insulating layers; and a stiffener having a plurality of plated through vias, said stiffener non-electrically connectedly attached to said one or more electrically conductive layers separated by one or more insulating layers;

wherein one of said one or more electrically conductive layers is a topmost layer on said printed circuit board;

wherein said topmost layer has one or more components mounted on it;

wherein said one or more components mounted are in electrical connection with a circuit routing on a circuit routing layer which is other than said topmost layer.

3. A printed circuit board comprising:
one or more electrically conductive layers separated by one or more insulating layers; and
a stiffener having a plurality of plated through vias, said stiffener non-electrically connectedly attached to said one or more electrically conductive layers separated by one or more insulating layers;
wherein one of said one or more electrically conductive layers is a topmost layer on said printed circuit board;
wherein said topmost layer has one or more gull wing surface mount components mounted on it;
wherein said one or more gull wing surface mount components mounted are in electrical connection with a circuit routing on said topmost layer.

4. A printed circuit board comprising:
one or more electrically conductive layers separated by one or more insulating layers; and
a stiffener having a plurality of plated through vias, said stiffener non-electrically connectedly attached to said one or more electrically conductive layers separated by one or more insulating layers;
wherein one of said one or more electrically conductive layers is a topmost layer on said printed circuit board;
wherein amid topmost layer has one or more gull wing surface mount components mounted on it;
wherein said one or more gull wing surface mount components mounted are in electrical connection with a circuit routing on a circuit routing layer which is other than said topmost layer.

5. The printed circuit board of claim 4 wherein said one or more insulating layers are 4 mil pre impregnated layers.

6. A printed circuit board comprising:
one or more electrically conductive layers separated by one or more insulating layers; and
a stiffener having a plurality of plated through vias, said stiffener non-electrically connectedly attached to said one or more electrically conductive layers separated by one or more insulating layers;
wherein each of said plurality of plated through vias has an opening in a top of said stiffener and a corresponding opening in a bottom of said stiffener and wherein said opening in said top and said opening in said bottom are coaxially located along a single longitudinal axis, said single longitudinal axis extending from said top of said stiffener to said bottom of said stiffener, and wherein a plated through via extends from said top opening to said bottom opening coaxially along said single longitudinal axis;
wherein one or more of said one or more electrically conductive layers is a power plane layer.

7. The printed circuit board of claim 6 wherein one or more of said one or more electrically conductive layers is a ground plane layer.

8. A printed circuit board comprising:
one or more electrically conductive layers separated by one or more insulating layers; and
a stiffener having a plurality of plated through vias, said stiffener non-electrically connectedly attached to said one or more electrically conductive layers separated by one or more insulating layers;
wherein said one or more electrically conductive layers is four or more electrically conductive layers;
wherein two of said four or more electrically conductive layers are circuit routing layers.

9. The printed circuit board of claim 8 wherein two of said four or more electrically conductive layers are power and ground layers.

10. A printed circuit board comprising:
one or more electrically conductive layers separated by one or more insulating layers; and
a stiffener, said stiffener non-electrically connectedly attached to said one or more electrically conductive layers separated by one or more insulating layers;
wherein said stiffener is copper coated steel.

11. A printed circuit board comprising:
one or more electrically conductive layers separated by one or more insulating layers; and
a stiffener, said stiffener non-electrically connectedly attached to said one or more electrically conductive layers separated by one or more insulating layers
wherein said stiffener is aluminum coated steel.

* * * * *